(12) United States Patent
Thalheim

(10) Patent No.: US 6,972,611 B1
(45) Date of Patent: Dec. 6, 2005

(54) METHOD AND DEVICE FOR A STATE-DEPENDENT CONTROL OF THE TRANSIENT BEHAVIOR OF SEMICONDUCTOR POWER SWITCHES

(75) Inventor: Jan Thalheim, Obfelden (CH)

(73) Assignee: CT Concept Technologie AG, Biel (CH)

( * ) Notice: Subject to any disclaimer, the term of this patent is extended or adjusted under 35 U.S.C. 154(b) by 0 days.

(21) Appl. No.: 10/332,702

(22) PCT Filed: Jul. 13, 2000

(86) PCT No.: PCT/IB00/00949

§ 371 (c)(1),
(2), (4) Date: May 5, 2003

(87) PCT Pub. No.: WO02/07315

PCT Pub. Date: Jan. 24, 2002

(51) Int. Cl.[7] .......................................... H03K 17/687
(52) U.S. Cl. ...................... 327/434; 327/427; 327/380; 327/381
(58) Field of Search ............................... 327/430–434, 327/376, 377, 380, 381, 427, 387–389, 436, 327/108, 110, 111; 307/126

(56) References Cited

U.S. PATENT DOCUMENTS

| | | | |
|---|---|---|---|
| 4,894,568 A | | 1/1990 | Pavlin .......................... 307/584 |
| 5,566,063 A | | 10/1996 | Gerster et al. ................. 363/98 |
| 5,808,504 A | * | 9/1998 | Chikai et al. ................. 327/434 |
| 5,877,646 A | * | 3/1999 | Jorg ............................. 327/374 |
| 6,111,453 A | | 8/2000 | Uchida et al. ............... 327/384 |
| 6,127,746 A | * | 10/2000 | Clemente ..................... 307/131 |
| 6,271,709 B1 | * | 8/2001 | Kimura et al. ............... 327/434 |

(Continued)

FOREIGN PATENT DOCUMENTS

DE    197 44 848    4/1999

(Continued)

OTHER PUBLICATIONS

Rüedi H.: *Intelligent Interfaces Between Power and Control: Gate Drivers for IGBTs*, Components, vol. XXXI, No. 3, 1996, pp. 8-11, XP002162535.

(Continued)

*Primary Examiner*—Timothy P. Gallahan
*Assistant Examiner*—Hai L. Nguyen
(74) *Attorney, Agent, or Firm*—Kenyon & Kenyon

(57) ABSTRACT

The invention relates to a comprehensive control method for switch on and off processes of power semiconductor switches ($S_1$–$S_4$). In a switching phase A the collector current transient $di_c/dt$ is controlled in order to safeguard a controlled clear-off of the edge zones of a serial freewheeling diode ($D_s$). In a switching phase B the collector voltage gradient $dv_{CE}/dt$ is controlled in order to specifically switch the power semiconductor switch ($S_1$–$S_4$), thereby establishing a closed control loop by returning primary and optionally secondary condition variables ($v_c$, $dv_c/dt$, $i_c$, $di_c/dt$, $i_G$, $v_G$, $di_G/dt$, $dv_G/dt$) of the power semiconductor switch ($S_1$–$S_4$). The embodiments relate inter alia to prephases A0, B0 for achieving the controllability of the power semiconductor switch ($S_1$–$S_4$), a $v_{CE}$ control by defining a collector voltage set-point function $v_{CE}^{ref}$ (t), detection of a transfer time ($t_1$, $t_2$) of switching phases A and B, a variable controller amplification ($k_p(t)$), an upper and lower limit ($S_M$, $S_m$) in accordance with an ideal gate current gradient ($i_G(t)$) and a tolerance band control for the collector voltage ($v_{CE}$). The invention further relates to a gate driver (GT), preferably with partitioned amplifier stages (7a, 7b) for carrying out the inventive method, and to a power semiconductor switch ($S_1$–$S_4$) and a series connection of power semiconductor switches ($S_1$–$S_4$) that are provided with such a gate driver (GT).

32 Claims, 8 Drawing Sheets

U.S. PATENT DOCUMENTS

Figure 1:
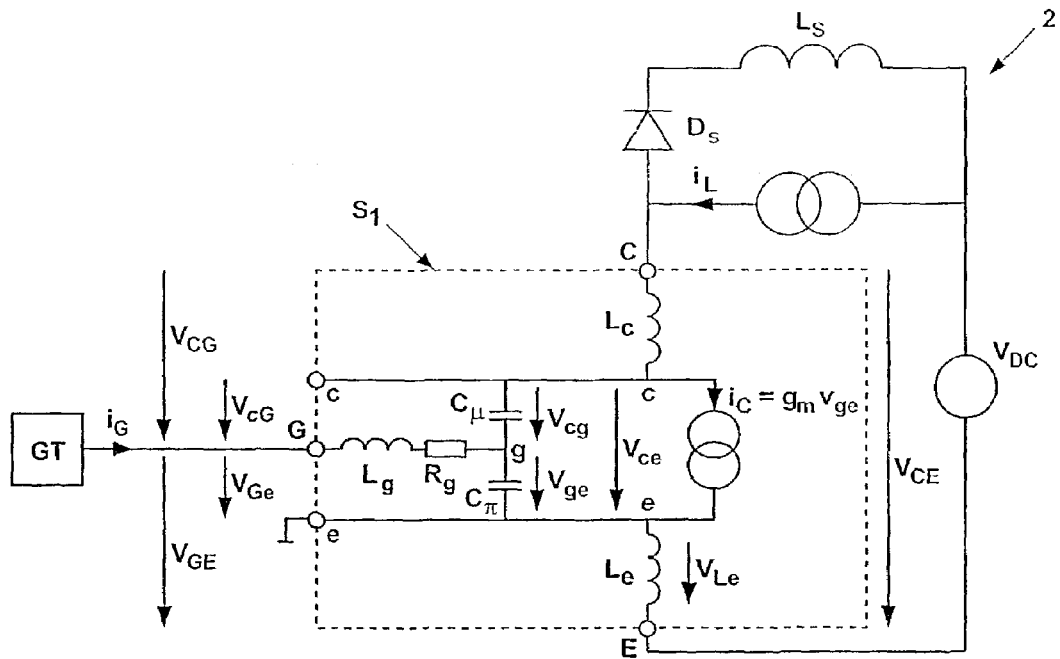

| | | | |
|---|---|---|---|
| 6,285,235 B1 * | 9/2001 | Ichikawa et al. | 327/374 |
| 6,323,717 B1 * | 11/2001 | Omura et al. | 327/434 |
| 6,424,187 B1 * | 7/2002 | Takahashi et al. | 327/110 |
| 6,633,195 B2 * | 10/2003 | Baudelot et al. | 327/430 |

FOREIGN PATENT DOCUMENTS

| | | |
|---|---|---|
| WO | WO 97/19110 A | 5/1997 |
| WO | WO 97/43301 A | 11/1997 |
| WO | WO 99/28745 A | 6/1999 |
| WO | WO 00/23564 A | 4/2000 |
| WO | WO 01/11087 A | 2/2001 |

OTHER PUBLICATIONS

Rüedi H.: *Dynamic Gate Controller (DGC) —A New IGBT Gate Unit for High Current/High Voltage IGBT Modules*, International Power Conversion—Jun. 1995 Proceedings, Jun. 1995, pp. 241-249, XP000991349, Nürnberg, Germany.

Crystal, *Science, 270*, 404-410 (1995).

Sewalt et al., *Mol. Cell. Biol., 19* (1), 777-787 (Jan. 1, 1999).

Jan Thalheim: "Control Strategies for Balancing of Series and Parallel Connected IGBT/Diode Modules", Hartung-Gorre Verlag.

Konstanz, Series in Microelectronic, vol. 139, 2004, pp. v-xvii and 1-187.

Musumecci et al.: "A New Adaptive Driving Technique for High Current Gate Controlled Devices", IEEE 0-7803-1456-5/94, pp. 480-486.

S. Igarashi et al.: "An Active Control Gate Drive Circuit for IGBTs to Realize Low-noise and Snubberless System", IEEE 0-7803-3993-2/97, pp. 69-72.

Hwang-Geol Lee et al.: "An Improved Gate Control Scheme for Snubberless Operation of High Power IGBTs", IEEE 0-7803-4067-1/97, pp. 975-982.

* cited by examiner

METHOD AND DEVICE FOR A STATE-DEPENDENT CONTROL OF THE TRANSIENT BEHAVIOR OF SEMICONDUCTOR POWER SWITCHES

This invention relates to the field of power electronics. It relates to a method and a device for the regulation of the transient behavior of semiconductor power switches in accordance to the preamble of the independent claims.

Such a method is disclosed in the article of H. Rüedi et al., "Dynamic Gate Controller (DGC)—A new IGBT Gate Unit for High Current/High Voltage Modules", PCIM'95 (Official Proceedings of the International Power Conversion), p. 241–149, Nuremberg, Germany, 1995. An IGBT is driven by a dynamic gate controller (DGC) in such a manner that specified constant values of the time derivative of the collector-emitter voltage over the IGBT (voltage gradient $dv_{CE}/dt$) and of the current through the free-wheeling diode or the IGBT (collector current gradient $di_C/dt$) are maintained during switching independently of the load current and the DC bus voltage. For this purpose, signals proportional to the voltage gradient and current gradient are fed back to the input of the gate driver. The voltage over the emitter—auxiliary-emitter inductance of an IGBT-module or the signal from a field probe at a power terminal of an IGBT-module serves as signal for the current gradient $di_C/dt$.

Even though the DGC allows to avoid a complicated application with a snubber network, the DGC is poorly suited for IGBTs arranged in series. Although the current gradient $di_C/dt$ for every IGBT module in series is identical, differences between the individual transfer factors of the IGBT regulation loops lead to deviations from the ideal gate current. These offsets lead to a different charging of the equivalent output capacitances of the IGBTs and therefore to an uncontrolled increase of the individual collector-emitter voltages of single IGBTs. Hence, IGBTs arranged in series cannot be synchronously switched with sufficient accuracy. In that case, the serial collector-emitter voltages can then only be symmetrized by reducing the switch-on time at the expense of higher transient losses.

Furthermore the DGC controller is not suited for reliably regulating the strongly non-linear behavior of IGBTs, in particular during fast switch-on, because of the constant and in part contradicting reference values for the voltage and current gradients. In particular, the transition behavior of both control circuits for the current gradient $di_C/dt$ and the voltage gradient $dv_{CE}/dt$ remains uncontrolled. In an extreme case the controllability of the IGBTs is lost due to an oscillating transition behavior during the switching operation.

A further problem results from the trend to reduce the emitter-auxiliary-emitter inductance. The high signal amplification required for this leads to strongly limited regulation dynamics. Due to the finite slew rate of the control loops, among other things, the problem of the insufficient controllability in the range of transition is made worse.

In EP 0 797 301 a turn-on operation of a IGBT is controlled by a gate current being used as manipulated variable for regulating a gate. This relies on there being a quadratic dependence between the gate voltage above the threshold voltage and the load current. An IGBT control loop with a feedback of state variables, which characterize the state of the IGBT on the power side, to the gate driver is not provided. A control loop on the gate side only is, how-ever, insufficient for controlling the non-linear switching behavior of IGBTs.

It is an object of the invention to disclose a method and a device for actively regulating the transient switching operation of semiconductor power switches that is especially suited for synchronization of the switching behavior of serial semiconductor power switches.

In e first aspect of the invention a regulation method is suggested for transient switching operations of a semiconductor power switch, wherein the switch comprises at least one control terminal or one gate controlled by a gate driver, a first power terminal or collector and a second power terminal or emitter, wherein a free-wheeling diode is arranged in series to the semiconductor power switch, wherein furthermore, at least one actual value is determined or approximated for at least one primary state variable of the semiconductor power switch and is fed back to the gate driver, and the actual value and a reference value of the state variable are used as input values for generating a manipulated variable for the control terminal in such a manner that a collector current gradient of the semiconductor power switch is regulated in a phase A, in which the free-wheeling diode is in a conducting state, and a collector-emitter voltage gradient of the semiconductor power switch is regulated in a phase B, in which the free-wheeling diode is in a non-conducting state. Both gradients can be directly regulated values of the control loop or are indirectly regulated by other regulated values. The primary state variable serves to characterize the state, in particular the electric and/or thermal loads, of the semiconductor power switch in the control loop. It can be e.g. a collector voltage, a collector current or a gradient of these values. Values derived from state values are, in this context, considered themselves to be state values again.

The application, according to the invention, of a two phase model of the charge state of the serial free-wheeling diode for separating the $di_c/dt$ regulation from a $dv_{CE}/dt$-regulation of the semiconductor power switch allows, for the first time, to realize a reliable control of the strongly non-linear transient behavior of semiconductor power switches. The method can be applied to complete and partial turn-on and turn-off processes. In phase A, the main transient of the collector current $i_C$ is regulated by means of the $di_C/dt$ control loop in such a manner that the state of charge and therefore the conductivity of the free-wheeling diode can be switched with optimum speed, and, at the same time, an overshoot behavior of the collector current can be limited while switching on the semiconductor power switch. In phase B, the main transient of the collector-emitter voltage $v_{CE}$ is regulated by means of the $dv_{CE}/dt$ control loop in such a manner that the semiconductor power switch can be turned off or turned on with optimum dynamics and, at the same time, an overshoot of the collector voltage can be limited while turning off the semiconductor power switch. Controllability is maintained all the times during the transients because a uncontrolled transition behavior of both control loops and a resultant oscillatory behavior are effectively prevented.

In first embodiments the phases are passed in order A-B during a turn-on operation of the semiconductor power switch and in order B-A during a turn-off operation, wherein the semiconductor power switch is controlled in each case in a regulatable state in a preceding phase A0 and B0, respectively, namely, for example, in phase A0, by means of increasing a gate-emitter voltage over a threshold value $v_T$ or in, phase B0, by means of decreasing a gate-emitter voltage below a threshold value $v_T + i_C/g_m$ with $g_m$=transconductance of the semiconductor power switch.

In a second embodiment, in phase A, the absolute value of collector current gradient |diC/dt| and, in phase B, the absolute value of the collector-emitter voltage gradient |dv$_{CE}$/dt| are temporarily increased, and they are decreased towards the end of the phases. Thus, the transient switching operation can be accelerated and the power dissipation of the switch can, in addition, be reduced.

In a third embodiment, for improving the dynamics and stability of the method of regulation for at least a secondary state variable of the semiconductor switch, such as a gate voltage, a gate current, its gradient or a collector-emitter voltage gradient, an actual value is determined or approximated and fed back to an output stage of the amplifier of the gate driver. By such a comprehensive state regulation with feedback to one or more amplifier stages, resonant frequencies of the feedback loop are shifted, oscillations are damped, and, all in all, the frequency response of the method of regulation can correspondingly be modified in advantageous manner.

In a fourth embodiment, measured actual values (measured values) and/or approximated actual values (approximate values) are determined for at least one primary and/or secondary state variable and/or a value derived therefrom. The approximation can e.g. be carried out by means of differentiation or averaging of measured values, by extrapolation for determining approximate values of future actual values, by transformation from indirect measured values e.g. by means of predetermined correction or calibration factors or by combination of such steps. For example, a collector current can be determined from the gate emitter voltage or from a time integral of the gate current or the induction voltage over an emitter inductance. The gate emitter voltage can be determined from a time integral of the gate current.

In fifth embodiments a time dependent function for the reference value is provided and/or actual values of the state variable are repeatedly measured during the transient switching process. Furthermore, a modified reference value for at least one phase A, B, A0, B0 of the current or the next switching process can be provided based on a calculated or estimated control loop offset between a reference value and an actual value of a state variable. In this manner the regulation process can be carried out with high accuracy and be adapted to the current state of the system.

In sixth embodiments a collector voltage $v_c$, namely e.g. a collector-emitter voltage $v_{CE}$ or, in approximation, a collector gate voltage $v_{CG}$ is chosen as, preferably sole, primary state variable. Preferably, in a corresponding function $v_{CE}^{ref}$(t), $v_{CG}^{ref}$(t) of the reference voltage, the phase A is implemented by an amplitude step proportional to the collector current gradient di$_c$/dt to be controlled, and the phase B by immediately providing the collector-emitter voltage gradient dv$_{CE}$/dt to be controlled. With such a v$_{CE}$ control loop excellent dynamics and stability of the control loop can be achieved with comparatively simple means. The v$_{CE}$ control loop is, in addition, especially well suited for the voltage symmetrization of semiconductor power switches arranged in series. Variants are: at least a double value of an average gradient and/or a total change of amplitude of the reference value function of the voltage in phase B as compared to phase A, adaptation of an amplitude change in phase A as a function of the load current, of a shape of a time dependence of the collector current, of a temperature of the free-wheeling diode or of a break-off behavior of a current or a voltage at the free-wheeling diode, several amplitude steps in phase A for shortening the switching process, different collector-emitter voltage gradients in phase B for limiting the required gate current, implementation of a phase A0 by providing a preceding small amplitude step of the reference voltage function, initialization of a phase B0 by specifying a minimum value of the reference voltage function, determination, in phase A, of an improved modified reference voltage function by an adaptive modification of the reference voltage controlled by an actual value feedback or, where applicable, by a fixed modification of the reference value during the switch-on and/or switch-off process, and determination of offsets in the control loop at least for the collector voltage and the collector voltage gradient and application of the maximum control loop offset for generating the manipulated variable.

In seventh embodiments, a transition time between the phases A and B is detected in particular by means of a main criterion and/or an additional criterion for validating the main criterion for a measured or an approximated state variable.

In an eight embodiment, a control loop parameter of the method for regulation, such as a control loop gain, limits for the manipulated value, feedback factors or a feedback function, is adapted in discrete steps or continuously depending on measured or approximated values of a state variable or depending on an expected ideal manipulated variable. For example, a control loop gain and/or limits for the manipulated variable are chosen to be large in the edge regions of phases A and/or B and, where applicable, to be maximum in the phases A0 or B0, and are decreased upon transition between the phases A, B, i.e. at large collector-emitter voltages and large collector currents. Hence, by adapting the control loop gain the reduced transconductance in the switched-off state and in the increased gate-collector or Miller capacity of the semiconductor power switch in the switched-on state are compensated and the dynamics and accuracy of the control loop are optimized by a reduction of the control loop gain during the transient switching process. For this, the control loop gain function is varied in steps for large control loop gain and comparatively continuously for small control loop gain. By an adaptation of the upper and lower limits of the manipulated variable in the same sense, oscillations in the manipulated variable due to resonant oscillations of the nonlinear control loop are limited and therewith the reliability of the regulation process is further increased. For an expected ideal manipulated variable a time dependence of the absolute value of a gate current (|i$_G$|) can be set to be proportional to $t_A^{-0.5}$ in the phase A and proportionally to $t_B^2$ in the phase B, wherein $t_A$, $t_B$= time values for the phases A, B.

In a ninth embodiment an actual value of a primary state variable is kept within a tolerance interval given by an upper and a lower reference value function. Preferably, a phase C is passed during switch-off after the phase A, where a semiconductor power switch is partially and temporarily switched-on upon each increase of the collector voltage above a predetermined maximum value by means of a pulsed gate current until the collector voltage has dropped to a minimum voltage that can be specified.

In tenth embodiments a v$_{CE}$ regulation is applied to a switch-on or switch-off process of an arrangement of i=1 . . . n semiconductor power switches in series by v$_{CE}$ regulating at least n−1 switches. During a switch-on process, the phases A0 can be introduced individually, in particular asynchronously, for each switch in order to bring all semiconductor power switches into the range where regulation is possible. In the phase A, a main part of the total voltage drop induced over the leakage inductance of the series arrangement can be attributed to a single semiconductor power switch in order to achieve a steep initial rise of the collector current gradient. Alternatively, the switch-on times for phase A can be substantially synchronized by detecting an increase of an actual value of the collector current gradient $di_c/dt$ and/or the collector current $i_c$ above a limiting value. In each case a substantially common transition time between the phases A and B for all semiconductor power switches is guaranteed because of the vCE closed loop control.

In an eleventh embodiment, in an inverter with serial semiconductor power switches and free-wheeling diodes arranged parallel thereto, a transient switch-on process of the first bridge arm is regulated according to the invention while, in the second bridge arm, a switch-off transient of the free-wheeling diodes is regulated by partially switching on parallel semiconductor power switches in such a way that the anode-cathode voltages and/or power dissipations of the free-wheeling diodes are symmetrized.

In a second aspect the invention relates to a gate driver designed for carrying out the method according to the invention. Such a gate driver comprises measuring means and processing means for at least a primary state variable of a semiconductor power switch, a reference value generator, an actual value—reference value comparator and an amplifier for generating a manipulated variable for a control terminal or a gate of the semiconductor power switch, wherein the reference value generator comprises a first generator for generating a first reference value by means of which, in a phase A where a free-wheeling diode in series to the semiconductor power switch is in a conducting state, the manipulated variable is adapted for regulating a collector current gradient $di_c/dt$ of the semiconductor power switch, wherein the reference value generator further comprises a second generator for generating a second reference value, by means of which, in a phase B where the free-wheeling diode is in a non-conducting state, the manipulated variable is adapted for regulating a collector-emitter voltage gradient $dv_{CE}/dt$ of the semiconductor power switch.

In a first embodiment, the measuring means and processing means comprise a signal detector and a actual value generator for a collector voltage and a collector current gradient of the semiconductor power switch. Furthermore, the first generator for generating a collector voltage amplitude variation and the second generator for generating a collector voltage current gradient are switched off. Preferably, the reference voltage generator comprises means for calculating all reference values from a common reference voltage function that can be specified.

In a second embodiment the actual value generator comprises a differentiator for generating a gradient of actual values and an adder for the weighted addition of actual values and actual value gradients. Alternatively, the actual value generator and the reference value generator comprise an extrema value generator for determining a maximum of an absolute value of standardized control loop offsets of the collector voltage and of the collector voltage gradient.

In a third embodiment, the gate driver comprises detection means for determining a transition time between the phases A and B, which in particular comprise a signal detector and a calculator unit with a threshold value switch for a main criterion as well as, optionally, a generator for an additional criterion and a validation device.

In a forth embodiment, the gate driver additionally has a signal detector for feeding back actual values of at least one secondary state variable to at least one amplifier output stage.

In a fifth embodiment, the gate driver comprises means for adapting control loop parameters, such as a control loop gain, an upper bound or a lower bound for the manipulated variable or a feedback coefficient or a feedback function for a signal detection of a primary and/or secondary state variable. In particular the means are designed for an approximate control of an absolute gate current in the phase A proportional to $t_A^{-0.5}$ and in the phase B proportional to $t_b^2$ and in the range of a transition time of the phases A and B for control by a minimum.

In a sixth embodiment, the amplifier is a current amplifier for a gate current manipulated variable. The amplifier can have several output stages.

In seventh embodiments, the gate driver comprises an amplifier with at least one output stage for generating a controlled variable for a control terminal or a gate of a semiconductor power switch, wherein the output stage comprises at least one linearly adjustable first current source for generating small gate currents with a small regulation control loop offset and a large regulation stability as well as at least one second current source that is adjustable in non-linear or step wise manner and that can be added in parallel for generating large gate currents with high regulation dynamics. By means of this structure of the current source it is possible to generate strong gate currents with extremely short rise times at the beginning and the end of the switching operation and small gate currents with exact regulatability during the transition in an intermediate range between the phases A and B for the control terminal of the semiconductor power switch.

In following eighth embodiments, the first and the second current source, respectively, are divided into several logical and/or physical first and second partitions. Furthermore, the gate driver comprises a structure control for activating the first and/or second current sources and/or of partitions of the first and/or second current source. The structure control is in particular designed such that (i) in the course of the first phase B or A of a switching process the second partitions can be switched-off successively, and then the first partitions can be regulated down and/or switched of successively, and that (ii) in the course of the second phase B or A of a switching process the first partitions can be regulated up and/or on switched on successively and then the second partitions can be switched on successively. In addition, all partitions can be activated in phases A0 and B0. The structure control can also be designed such that a pulsed gate current can be generated by switching on and switching off second and/or first partitions.

In a ninth embodiment, the first current source comprises a linear cascade of current mirror arrangements of transistors. In addition to this, the second current source can comprise a mirror arrangement of transistors, wherein a gate of an output transistor of the mirror arrangement can be switched between two voltages. Furthermore, an actual value-reference value comparator for quickly driving the current sources can comprise a current mirror arrangement of transistors, and, in particular, can be divided into third partitions of several current mirror arrangements.

Furthermore, the invention relates to a semiconductor power switch or an arrangement of semiconductor power switches with at least one gate driver according to the invention. IGBTs, MOSFETs and/or BJTs are suited as semiconductor power switches. The arrangement can be an arrangement in series, an arrangement in parallel or a serial arrangement of arrangements in parallel, and in particular it can be a switch module, in particular an inverter, for traction, high voltage DC transmission, radio transmitters, inductive heating or inductive welding.

Further embodiments, advantages and applications of the invention result from the dependent claims as well as from the now following description with reference to the figures.

SHORT DESCRIPTION OF THE FIGURES

They show

Figure 2:
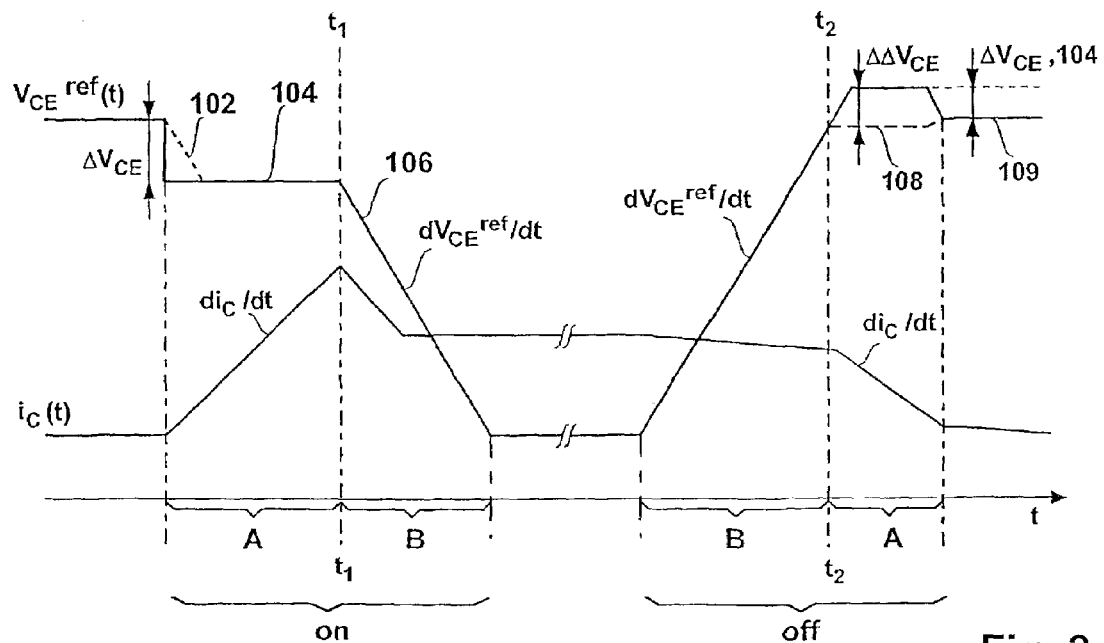
Figure 3:
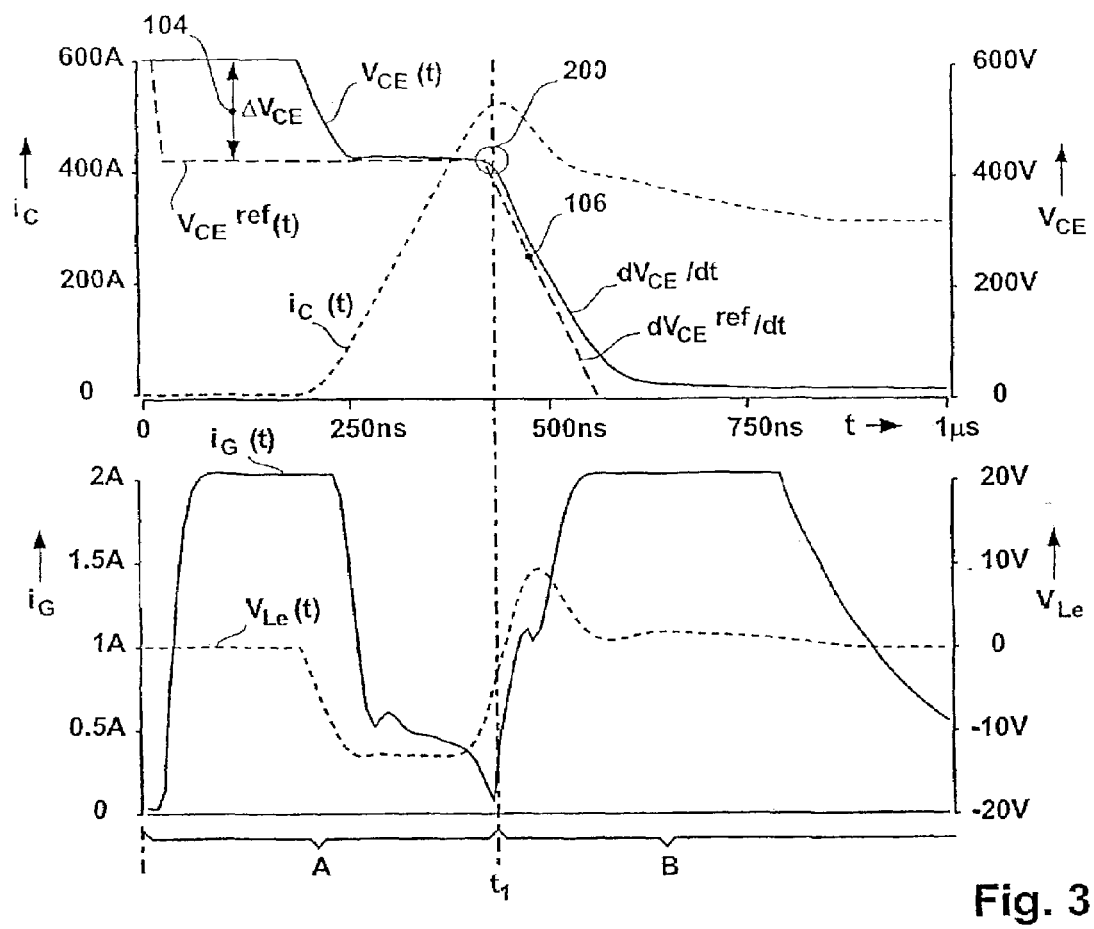
Figure 4:
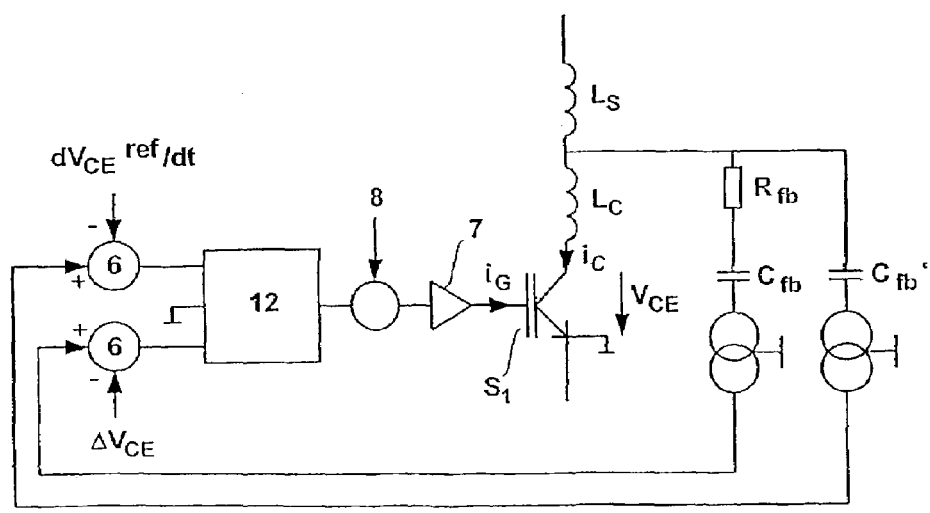
Figure 5:
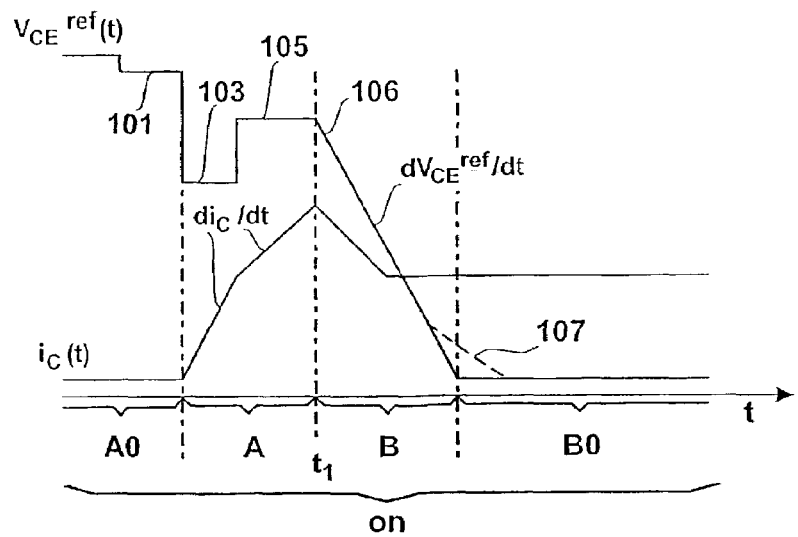
Figure 6:
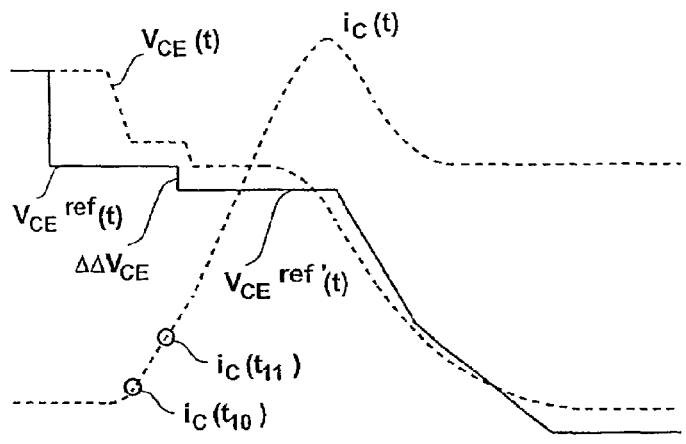
Figure 7:
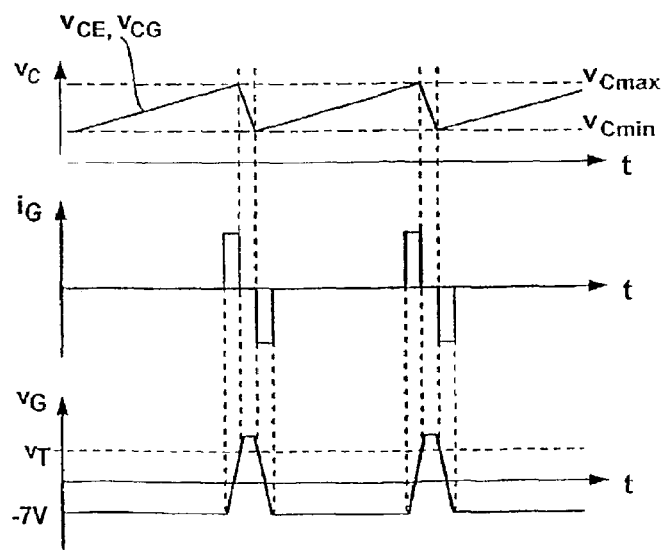
Figure 8:
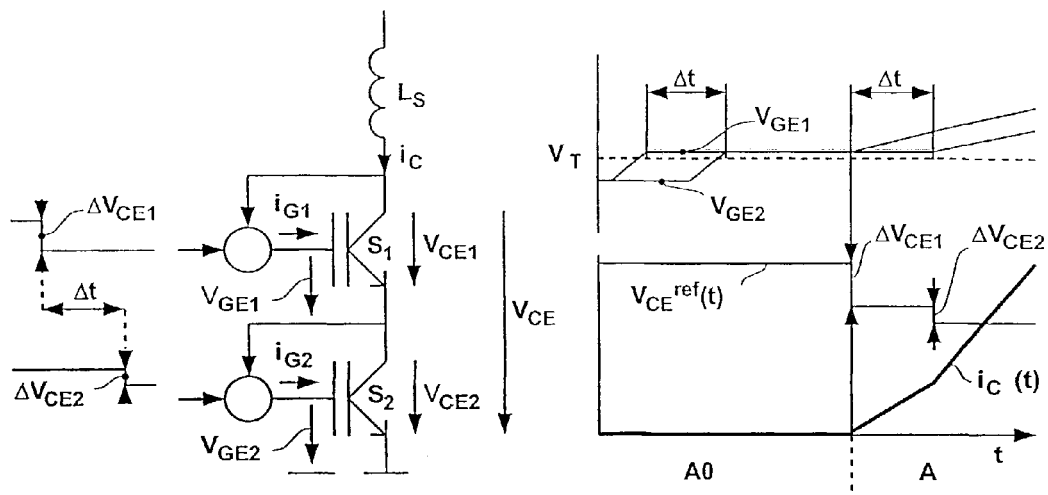
Figure 9:
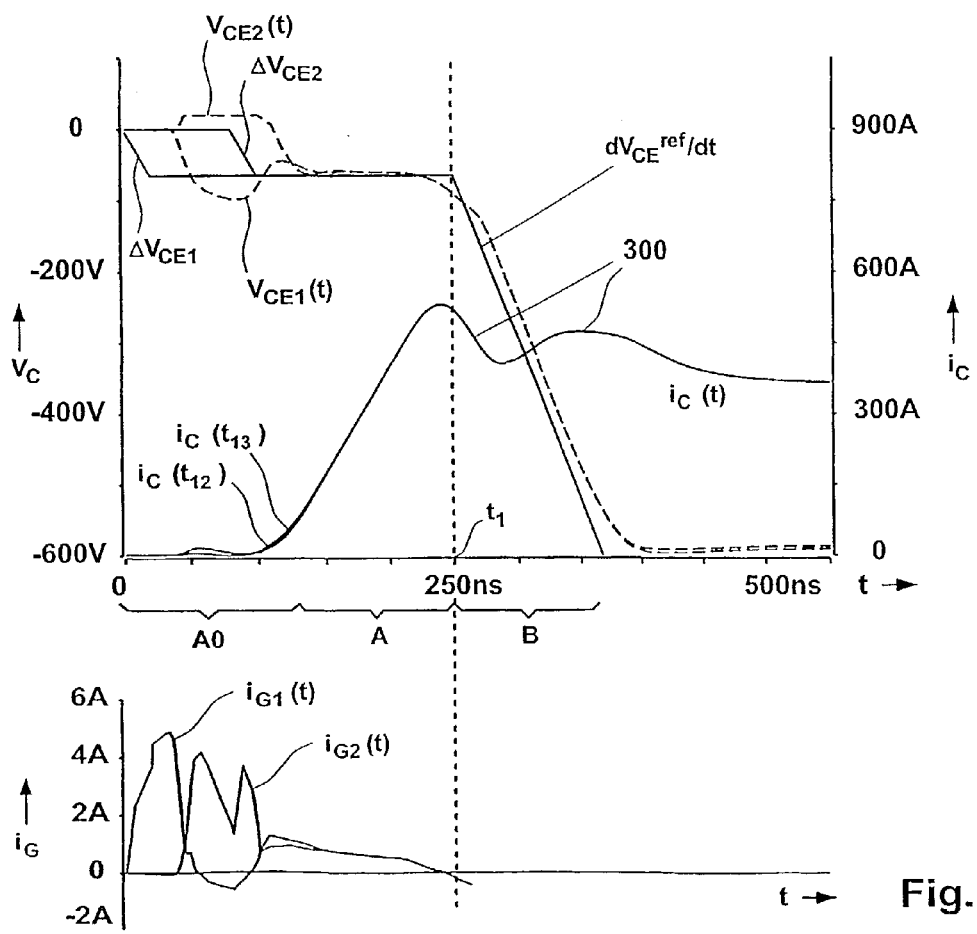
Figure 10:
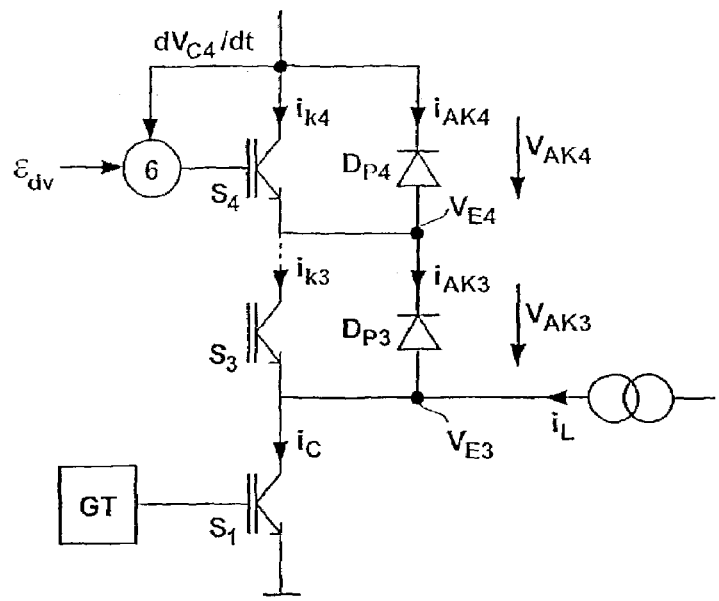
Figure 10:
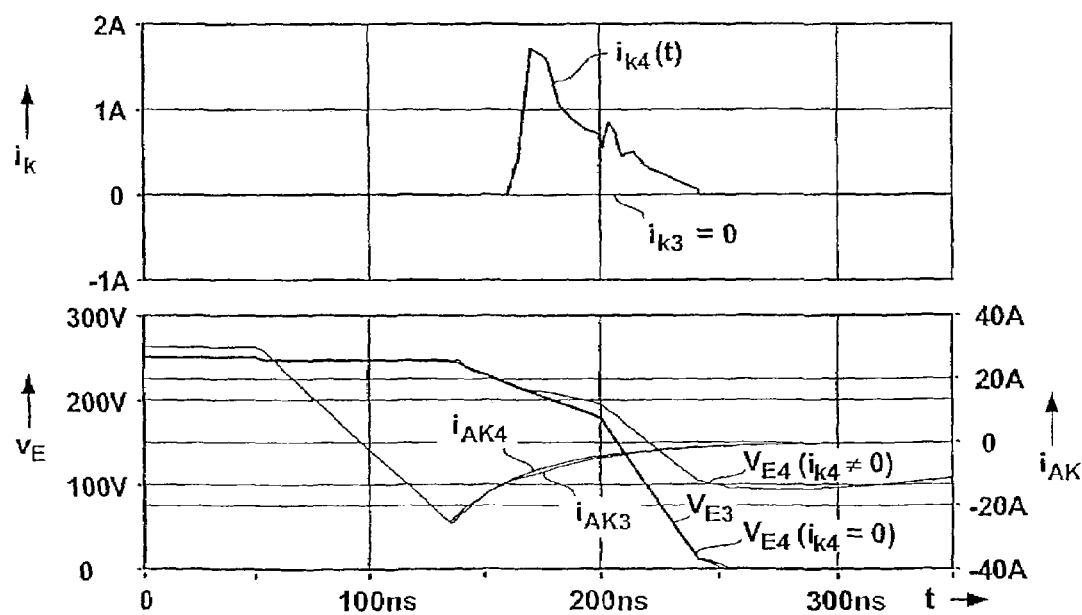
Figure 11:
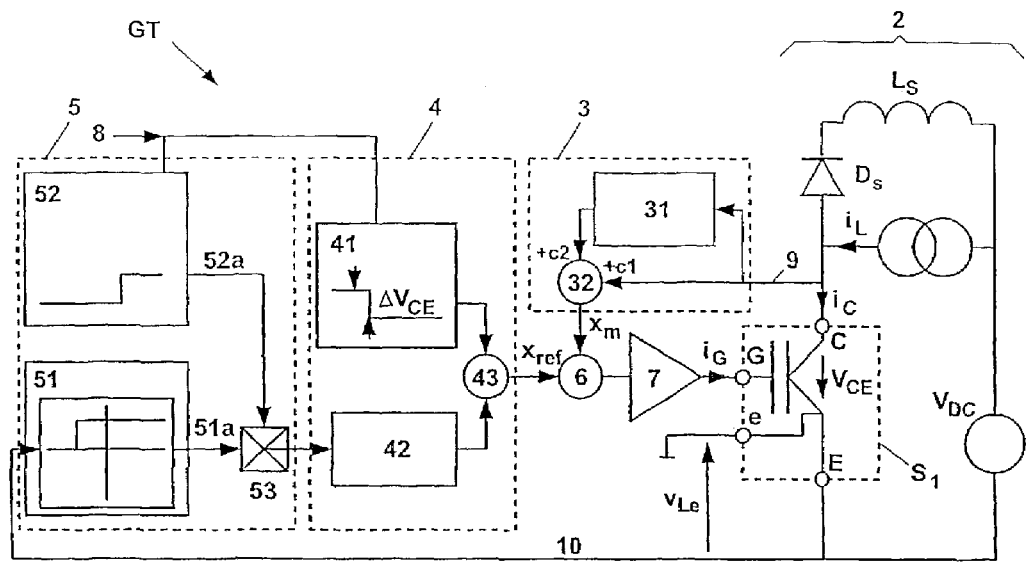
Figure 12:
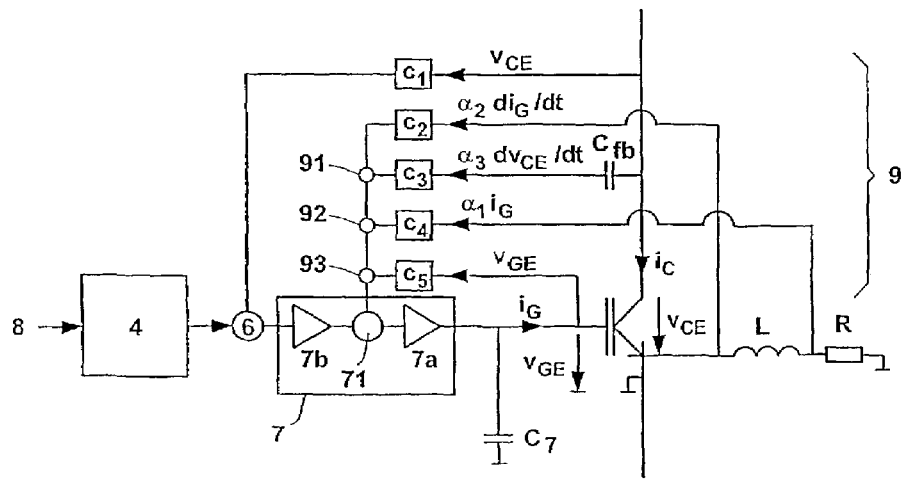
Figure 13:
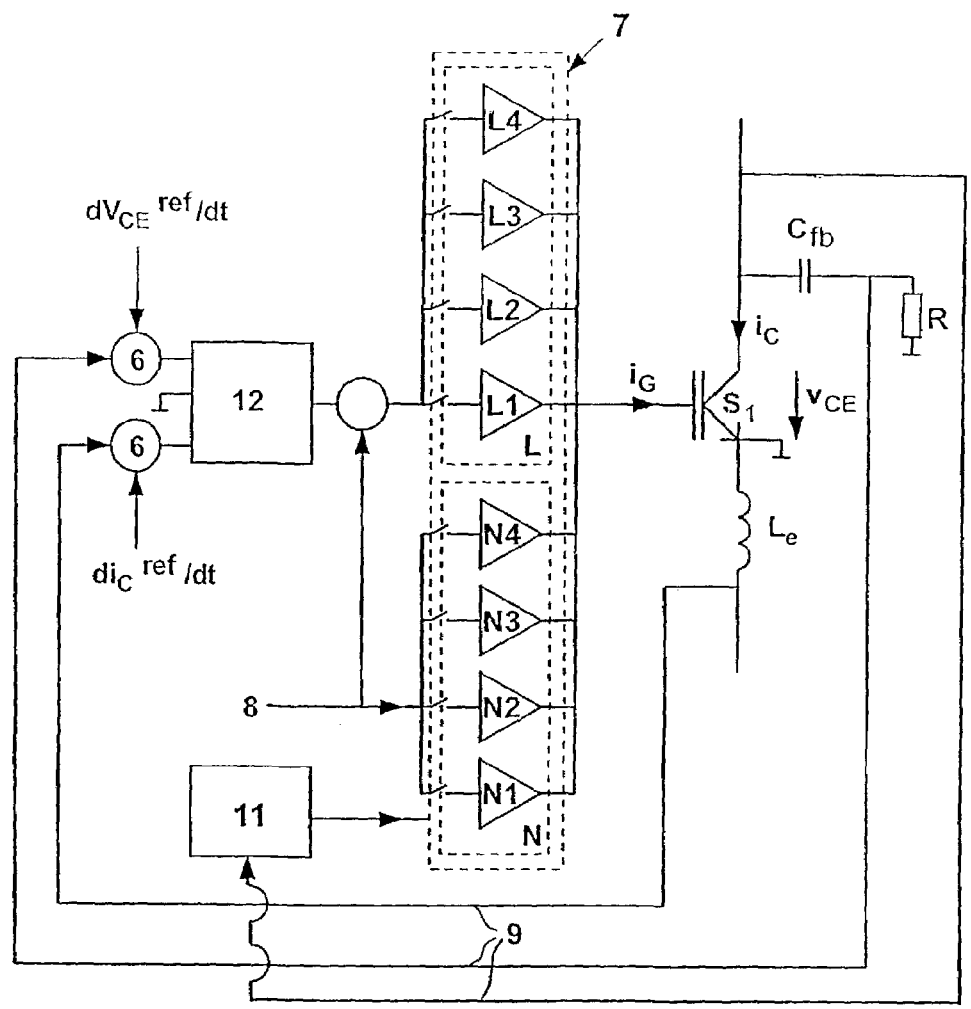
Figure 14:
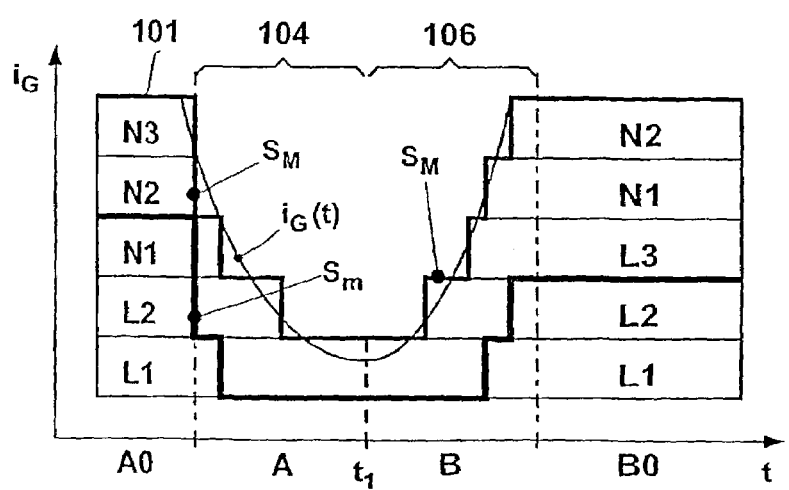
Figure 16A:
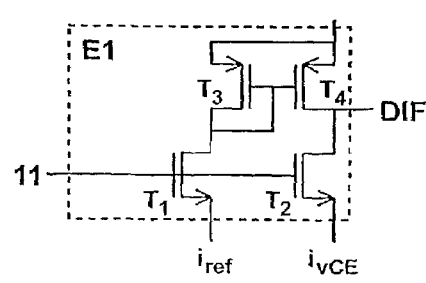
Figure 16B:
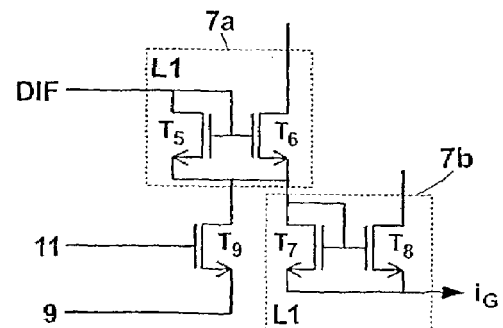
Figure 16C:
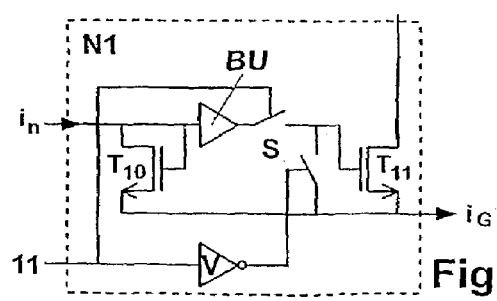

FIG. 1 a simplified equivalent circuit diagram for an IGBT semiconductor power switch;

FIGS. 2, 3 a $v_{CE}$ closed loop control of a switch-on and switch-off process by providing a reference value function $v_{CE}{}^{ref}(t)$ for the collector-emitter voltage;

FIG. 4 a gate driver according to the invention for implementing the $v_{CE}$ closed loop control;

FIGS. 5, 6 modified $v_{CE}$ closed loop controls for improving the regulation dynamics and regulation accuracy;

FIG. 7 a tolerance interval regulation of the collector voltage $v_C$ with pulsed manipulated variable;

FIGS. 8, 9 applications of the vCE closed loop control to an arrangement of semiconductor power switches in series;

FIG. 10 a $v_{CE}$ closed loop control for a bridge arm of an inverter in combination with a closed loop control for symmetrization of the voltage distribution in the other half bridge;

FIG. 11 a gate driver for carrying out the regulation method of the invention;

FIG. 12 a gate driver with a feedback for secondary state variables;

FIG. 13, 15 gate drivers with input and output amplifier stages that are partitioned according to the invention, FIG. 14 an ideal gate current time dependence and a time dependence approximated according to the invention during a switching operation; and FIG. 16a, 16b, 16c a set-up of individual amplifier partitions.

In the figures, similar parts are provided with the same reference numerals.

WAYS FOR CARRYING OUT THE INVENTION

FIG. 1 shows a semiconductor power switch S1, such as an IGBT module, for switching a load circuit 2, which is modeled by a DC voltage source $V_{DC}$, a current source for the load current $i_L$ and an inductance $L_S$. A free-wheeling diode $D_S$ is in series to the semiconductor power switch $S_1$. A control terminal G of the switch $S_1$ is fed by a gate driver GT with a gate current $i_G$ for driving the power branch collector C-emitter E. The simplified model for the internal set up of the switch $S_1$ comprises a gate input inductance $L_G$, a gate resistor $R_g$ and an auxiliary gate g, a collector inductance $L_C$ and an auxiliary collector c, an auxiliary collector auxiliary gate or Miller capacitance $C_\pi$, an emitter inductance $L_e$ and an auxiliary emitter e as well as an auxiliary gate auxiliary emitter capacitance $C_\pi$. The voltages are typically characterized by indices designating the reference points. In short, the voltages $v_{CE}$, $v_{ce}$, $v_{CG}$, $v_{cg}$ or e.g. also $v_{Ce}$, $V_{cE}$, $v_{Cg}$, $v_{cG}$ can be designated as collector voltages $v_C$, and the $v_{GE}$, $v_{ge}$ or e.g. also $v_{Ge}$, $v_{gE}$ as gate voltage $v_G$. $v_{Le}$ is the inductance voltage over the emitter inductance $L_e$. For the collector current $i_C$ the relation $i_C = g_m \cdot v_{ge}$ hold true, wherein $g_m$=transconductance of the switch $S_1$.

FIG. 2 shows an example of a two phase regulation according to the invention for a switch-on and switch-off process of the switch $S_1$. When switching on, a step $\Delta v_{CE}$, 104 or a more or less steep gradient 102 for the reference value $v_{CE}{}^{ref}$ or a reference value function $v_{CE}{}^{ref}(t)$ for the collector-emitter voltage $v_{CE}$ are specified. Due to the equation $$\Delta v_{CE} = V_{DC} - v_{CE} \approx L_s \cdot di_C/dt \quad (G1)$$

which can be derived in approximation, a collector voltage gradient $dv_C/dt$ proportional to the amplitude change $\Delta v_{CE}$ is induced by the inductance $L_S$. Hence, the current gradient $di_C/dt$ through the power terminals C, E caused by the sweeping behavior of the free-wheeling diode in phase A is indirectly regulated via the voltage $v_{CE}$ between the power terminals C, E. At the end of phase A, the "reverse recovery" behavior of the diode $D_S$ leads to a self passivation of the collector current transient. As soon as the edge zones of the diode $D_S$ are swept free from carriers, the diode $D_S$ can build up a reverse voltage, $\Delta v_{CE}$ increases and the collector-emitter voltage $v_{CE}$ falls below the reference value $V_{CE}{}^{ref}$. Then, the phase B can be introduced, during which the gradient of the collector-emitter voltage $dv_c{}^{ref}/dt$ is controlled by specifying a reference value $dv_c{}^{ref}/dt$ or a reference value function $dv_c{}^{ref}(t)/dt$. During switch-off, the phase B and then the phase A are passed in analog manner.

It is also possible to directly specify separate reference values $di_C{}^{ref}/dt$ and $dv_{CE}{}^{ref}/dt$ or reference value functions $di_C{}^{ref}(t)/dt$ and $dv_{CE}{}^{ref}(t)/dt$ for the gradients of the collector current $di_c/dt$ and the collector-emitter voltage $dv_{CE}/dt$. In any case, the gradients can only be controlled indirectly through a manipulated variable value for the gate G. Suited manipulated values are a gate current $i_G$ or a gate voltage $v_G$. $i_G$ or $v_G$ or an approximation for $i_G$ or $v_G$ can be used for a feedback into the control loop, wherein the approximation can e.g. be gained by differentiation, integration, short time averaging, estimation, or similar, from time dependent values of $i_G$, $v_G$ or other state variables of the switch $S_1$. In addition, in the two-phase model for switching processes according to the invention, a closed control loop is implemented by determining or approximating at least one actual value of a primary state variable, in particular of the collector voltage $v_C$, of the collector current $i_C$ or a of value derived therefrom, such as a gradient, and by feeding it to the gate driver $G_T$. From the control offset between the actual value (also called regulation value, "plant output", "output" or "process variable") and the reference value (also called guidance value or "reference variable"), the manipulated variable (also called "plant input) is determined.

FIG. 3 shows the actual gate current requirement $i_G(t)$ for implementing the phases A and B for a switch-on process. Shown are, at the top, the collector-emitter voltage reference function $v_{CE}{}^{ref}(t)$, the actual collector-emitter voltage function $v_{CE}(t)$ and the actual collector current function $i_c(t)$ as well as, at the bottom, the gate current $i_G(t)$ and the actual function of the emitter induction voltage $v_{Le}(t)$ proportional to the collector current gradient, wherein, according to a simplified model for the behavior of an IGBT switch $S_1$, the non-linearities of the transconductance $g_m$ as a function of the gate emitter voltage $V_{ge}$ and the Miller capacitance $C_\mu$ as a function of the gate emitter voltage $v_{CE}$ are approximated by the equations $$g_m = di_C/dv_{ge} = T^*(V_{ge} - v_T) \text{ for } v_{ce} > v_{ge} - v_T \quad (G2)$$

$$C_\mu = \text{const}^* V_{CE}^{-0.5} \quad (G3)$$

wherein T=transconductance parameter, $v_T$ gate threshold voltage for controllability of the IGBT $S_1$ and const=a constant. The transconductance $g_m$ is, for large values of $v_{ge} - v_T$ (e.g. several Volts) sublinear to $v_{ge} - v_T$.

First, by specifying a collector voltage step $\Delta v_{CE}$, 104, the gate current $i_G$ is driven to a maximum. As soon as the controllability of the IGBT $S_1$ has been reached, phase A is introduced by the fact that $v_{CE}(t)$ starts to decrease and $i_c(t)$ starts to increase. The start of phase A can easily be detected by an increase of the absolute value of the emitter inductance voltage $V_{Le}(T)$. As soon as the control loop offset $v_{CE}(t) - v_{CE}^{ref}(t)$ becomes small, the gate current $i_G(t)$ is regulated down. It can be shown that an ideal gate current in phase A decreases in its absolute value nearly proportionally to $t_A^{-0.5}$, wherein $t_A$=a time variable for phase A, and approximately $t_A$=0 can be used at the start of phase A. Close to the maximum value of the collector current $i_c(t)$ there is a range 200 of the transition time $t_1$ between phases A and B. There, the collector current gradient $di_C/dt$ cannot be maintained anymore because the edge zones of the free-wheeling diode $D_S$ are substantially swept clean. The regulation of the voltage gradient is started, the absolute value of the emitter inductance voltage $v_{Le}(t)$ decreases and the absolute value of the gate current $|i_G|$ is controlled by a minimum. Its rebound occurs ideally approximately proportionally to $t_b^2$, wherein $t_B$=a time variable for the phase B and approximately $t_B$=0 can be used at the start of phase B. More or less strong deviations of the actual time dependence of the gate current $i_G(t)$ can occur due to the actual, fed back time dependence of a primary state variable (e.g. of $i_c(t)$) or due to the dynamics of the control loop.

Hence, the invention implements, for the first time, a complete closed-loop control of the switch-on and switch-off process of a semiconductor power switch $S_1$, in particular by taking into account its strongly non-linear transconductance $g_m$ and Miller capacitance $C_\mu$ and the strongly non-linear discharge behavior of the edge zones of the free-wheeling diode $D_S$. By means of the 2-phase regulation, the main transient of the collector current $i_c(t)$ is regulated in phase A with $di_c/dt$ as regulated value, and the main transient of the collector voltage $v_c(t)$ in phase B with $dv_{CE}/dt$ as regulated variable.

FIG. 4 shows a simple arrangement for driving the transition behavior of the control loops in the phases A and B for the case of a regulation of $v_{CE}$ according to FIGS. 2 and 3. Actual values for the change of amplitude $\Delta v_{CE}$ and the gradient $dv_{CE}/dt$ of the collector voltage $v_C$ are coupled out over a resistor and capacitors $R_{fb}$, $C_{fb}$ and $C_{fb}$, and compared to the corresponding reference values $\Delta v_{ce}^{ref}$ and $dv_{CE}^{ref}/dt$ in difference generators 6. The closed loop control offsets are normalized and the offset with the larger absolute value is fed by a maximum value generator 12 in dependence of a switching instruction as input value to a current amplifier 7 for generating the gate current $i_G$. Evidently, a minimum value generator, each input of which is connected to a sum of a signed control loop offset with a switching instruction voltage 8 of higher voltage with opposite sign, is equivalent to the maximum value generator 12. In this sense, 12 generally denotes an extrema value generator. As, in phase A, by specifying the amplitude step $\Delta v_{CE}^{ref}$, the control loop off-set $\Delta v_{CE} - \Delta v_{CE}^{ref}$ dominates, and, in phase B, by specifying a collector voltage gradient $dv_{CE}^{ref}/dt$ that is steeper than the actual value, or of a corresponding collector voltage step, the control loop offset $dv^{CE}/dt - dv_{CE}^{ref}$ dominates, the desired quantity is regulated in this way and a controlled transition between phase A and phase B is guaranteed.

A particularly simple control loop with feedback of the collector voltage vCE and the collector voltage gradient $dv_{CE}/dt$ can be implemented by weighted summation instead of using a maximum value generator 12. For the actual value $x_m(t)$ and the reference value $x_{ref}(t)$ of the combined state variables and for the gate current $i_G$, the following equations are valid:

$$x_m(t) = c_1 * v_{CE}(t) + c_2 * dv_{CE}(t)/dt \text{ and} \quad (G4)$$

$$x_{ref}(t) = c_1 * v_{CE}^{ref}(t) + c_2 * dv_{CE}^{ref}(t)/dt \text{ and} \quad (G5)$$

$$i_G(t) = k_p * (x_m(t) - x_{ref}(t)), \quad (G6)$$

wherein $k_p$=control loop gain. In a further embodiment, the feedback factor $c_1$ can be set to zero, such that the collector voltage gradient $dv_{CE}/dt$ is regulated directly. In this way devices can be dispensed with in the power circuit. To increase the stability of this embodiment, an additional integrator can be introduced into the control loop. The integration should be prevented or reduced during the switching process in phases A0 and B0 in order to improve the dynamics.

In the control loop process according to the invention, a transition time $t_1$, $t_2$ can also be determined between the phases A and B. For this purpose, in particular a main criterion, and, where applicable, an auxiliary criterion for validating the main criterion, are detected and used for the active introduction of the second phase B in a switch-on process. One or more of the following inequalities are especially suited as a main criterion:

$|V_{AK}| > \epsilon_{AK}$, wherein $V_{AK}$=a voltage over the free-wheeling diode $D_S$ and $\epsilon_{AK}$=a first threshold value that can be specified;

$|di_c/dt| < \epsilon_{diC}$, in particular $|v_{Le}|/L_e < \epsilon_{diC}$, wherein $\epsilon_{diC}$=a second threshold value that can be specified, wherein, in particular given a subsequent violation of this main criterion (e.g. by oscillations 300 in FIG. 9), a detection of the transition time $t_1$, $t_2$ is not revoked;

$|\Delta v_C| > \epsilon_{vC}$, wherein $\epsilon_{vC}$=a third threshold value that can be specified;

$|dv_c/dt| > \epsilon_{dvC}$, wherein $\epsilon_{dvCE}$=a fourth threshold value that can be specified;

$|i_G| < \epsilon_{iG}$, wherein $\epsilon_{iG}$=a firth threshold value that can be specified;

$|dv_G/dt| < \epsilon_{dvG}$, wherein $dv_G/dt$=a gradient of the gate voltage and $\epsilon_{dvG}$=a sixth threshold value that can be specified, $|v_G| < |v_{Gmax}| - \epsilon_{vGmax}$, wherein $v_{Gmax}$=a maximum value of the gate voltage and $\epsilon_{vGmax}$=a seventh threshold value that can be specified; and/or $t_1 > t_M$ or $t_2 > t_M$, wherein $t_M$=a maximum duration from the start of the switching process, and/or from a detectable change of state variables $v_c$, $dv_c/dt$, $i_c$, $di_c/dt$, $i_G$, $v_G$, $di_G/dt$, $dv_G/dt$, in particular as soon as $|\Delta v_C| > \epsilon_{vC} \cdot \epsilon_1$ holds true with $\epsilon_1 < 1$.

A faster determination or approximation of the voltage $v_{AK}$ over the free-wheeling diode $D_S$ is possible according an equation $V_{AK} = -\delta v_{CE} + V_{AKf} + K \cdot V_{Le}$, wherein $V_{Le}$ and a flow voltage $V_{AKf}$ of the free-wheeling diode $D_S$ in a phase A0 preceding phase A are measured or estimated. $\delta v_{CE}$ designates a change of amplitude of the collector-emitter voltage in phase A as compared to phase A0 and K a proportionality factor. In particular, $K = -(L_o - L_C)/L_e$ applies, wherein $L_o = L_C + L_e + L_S$ = total inductance of the load circuit 2, $L_C$=collector inductance, or K is a proportionality factor that can be specified according to an estimated value for $V_{AK}$ (e.g. $0V < V_{AK} < 4V$).

One or more of the following inequalities are especially suited as a additional criterion:

$|V_G| > \epsilon_{vG}$ with $\epsilon_{vG} > v_T$, wherein $\epsilon_{vG}$=a eighth threshold value that can be specified;

$|i_C|>\epsilon_{iC}$, wherein $\epsilon_{iC}$=a ninth threshold value that can be specified, and/or $t_1>t_m$ or $t_2>t_m$, wherein $t_m$=a minimum time duration from the start of the switching process.

Advantageously, the transition time is detected with an accuracy of better than 10%, preferably 4%, particularly preferably 2%, as compared to the duration of phase A.

FIG. 5 shows that, for a switch-on process, a phase A0 for achieving controllability of the collector current transient as a function of the gate current $i_G$ can be implemented through the small amplitude step 101 in the reference voltage value function $v_{CE}^{ref}(t)$. Furthermore, the phase A can be accelerated by specifying first a large amplitude step 103, and, in the course of phase A, an oppositely directed amplitude step 105 in $v_{CE}^{ref}(t)$. Analogously, in phase B, a temporarily increased or maximum voltage gradient 106 and, at the end of phase B, a reduced voltage gradient 107 can be used. In general, the time dependence of the reference voltage value function $v_{CE}^{ref}(t)$ is best specified by a piece-wise linear or trapezoidal function. Following phase B, a gate current $i_G(t)$ can be regulated in a phase B0 in such a manner that, in the phase B of the subsequent switch-off process, the controllability, i.e. a gate voltage $V_{GE}<V_T+i_C/g_m$ with $v_T$=threshold voltage, of the collector-emitter voltage gradient $dv_{CE}/dt$ by means of the gate current $i_G$ is guaranteed.

Examples for modifications of the reference value function $v_{CE}^{ref}(t)$ are shown in FIG. 6 for a switch-on process and in FIG. 2 for a switch-off process. During switch-on (FIG. 6), a control loop offset $v_{CE}(t)-v_{CE}^{ref}(t)$ can be detected and corrected by specifying a modified reference voltage value function $v_c^{ref}(t)=v_c^{ref}(t)+\Delta\Delta v_{CE}$, hence, in the present embodiment, by means of an additional small amplitude step $\Delta\Delta v_{CE}$. For detecting of the control loop off-set, the actual value of the collector current gradient $di_c/dt$ can e.g. be determined by measuring the collector current $i_c$ at least two times $t_{10}$ and $t_{11}$ and be compared to a reference value $di_C^{ref}/dt$. During switch-off (FIG. 2), 109 designates the desired stationary reference value for $v_{CE}$. In phase A, an amplitude step $\Delta v_{CE}$, 104 would have to be specified in such a manner that a voltage value 108 is always larger than the stationary reference value 109 in order to control the induction voltage over $L_S$. Furthermore, however, an overshoot of the collector-emitter voltage $v_{CE}$ can be prevented by temporarily specifying an amplitude step $\Delta v_{CE}$, 104 that is decreased by a correction value $\Delta\Delta v_{CE}$, 108 as a modified reference value $v_{CE}^{ref}$. In this way, in particular the voltage value 108 can be below the stationary reference value 109.

FIG. 7 shows a tolerance interval regulation by means of the collector voltage vC as a primary state variable. Here, a tolerance interval is specified by specifying a maximum value $v_{Cmax}$ and a minimum value $v_{Cmin}$ for $v_C$, and an actual value of $v_C$ is kept within the tolerance interval $v_{Cmax}$, $V_{Cmin}$ preferably by means of a pulsed manipulated signal $i_G$, $v_G$. In particular, a gate voltage pulse $v_G>v_T$ is generated by means of a positive and a subsequent, delayed negative current pulse $i_G(t)$. The duration of the gate voltage pulse $v_G>v_T$ is adapted by means of the delay of the negative voltage pulse $i_G(t)$ in such a way that the collector voltage $v_C$ falls to a specifiable value within the tolerance interval $v_{Cmax}$, $v_{Cmin}$.

FIGS. 8 and 9 show an advantageous application of the $v_{CE}$ control loop in a serial arrangement with, as an example, two semiconductor power switches $S_1$, $S_2$. Here, collector voltages $v_{C1}$ and $v_{C2}$, in particular $v_{CE1}$ and $v_{CE2}$, over each semiconductor power switch $S_1$, $S_2$ are regulated as described above. A synchronization of the phases A0 is not required. As shown in FIG. 8, a time delay $\Delta t$ and/or different reference voltage steps $\Delta v_{CE1}>\Delta v_{CE2}$ can be specified in order to assign a major part of the total voltage drop $\Delta v_{CE1}+\Delta v_{CE2}$ induced over the stray capacitance of the serial arrangement to a single semiconductor power switch $S_2$. In this way an exactly defined, steep initial rise of the collector current transient $i_C(t)$ is achieved. After the time delay $\Delta t$ the remaining semiconductor power switches $S_2$ are switched on, which increases the gradient of the collector current $di_C/dt$. By means of the reference voltage steps $\Delta v_{CE1}$, $\Delta v_{CE2}$, the time and amplitude of which can be specified individually, a desired distribution or symmetrization of thermal dissipation losses can be also achieved for the for the semiconductor power switches $S_1$, $S_2$.

FIG. 9 shows an example for synchronizing the phases A after an asynchronous start of the phase A or, where applicable, the phase A0. The gate current time dependencies $i_{G2}(t)$ and $i_{G1}(t)$ required for the vCE closed loop controls are shown until the start of phase B. The semiconductor power switch $S_2$ driven by a time delayed voltage step $\Delta v_{CE2}$ experiences first an overshoot of the collector voltage $v_{CE2}(t)$. As soon as all control loop offsets decrease or the controllability for all semiconductor power switches $S_1$, $S_2$ has been achieved, the collector current $i_C(t)$ starts to increase and phase A is started for all semiconductor power switches $S_1$, $S_2$ without further synchronization effort. In the case of preceding phases A0, phase A can be introduced actively for all semiconductor power switches $S_1$ as soon as the collector current $i_C$ or the collector current gradient $di_C/dt$ exceeds a specifiable threshold value. The collector current $i_C$ can e.g. be determined from a time integral of the induction voltage $v_{Le}$ over the emitter inductance $L_e$. The collector current gradient can e.g. be determined by measuring the collector current $i_C$ at different times $t_{12}$, $t_{13}$ and by calculating the gradient $di_C/dt$.

FIG. 10 shows, for a half bridge of an inverter, a first bridge arm with semiconductor power switches $S_3$, $S_4$ and parallel diodes $D_{p3}$ and $D_{p4}$ and a second bridge arm in simplified representation with only a single switch $S_1$. The regulation method according to the invention, and in particular the $v_{CE}$ closed loop control, is applied to $S_1$. Furthermore, in the simultaneous switch-off process of the second bridge arm, anode-cathode voltages $V_{AK3}$, $V_{AK4}$ and/or power dissipations of the free-wheeling diodes $D_{p3}$, $D_{p4}$ of the second bridge arm can at least be partially limited, and in particular symmetrized, by identifying at least one free-wheeling diode $D_{p4}$ with an excessive anode-cathode voltage gradient $dv_{AK4}/dt$ and by temporarily and/or partially closing, in a control loop operation, the corresponding parallel semiconductor power switch $S_4$ according to the regulation method. According to FIG. 10, $v_{C3}=v_{AK3}$, $v_{c3}=v_{AK3}$ and $v_C=v_{C3}+v_{C4}$ applies. In particular, the control loop operation is started as soon as phase B is detected in the regulation method. In the control loop operation, a manipulated signal $i_G$, $v_G$ can be specified in such a way that an absolute value of the collector voltage gradient $|dv_{C4}/dt|$ of the corresponding semiconductor power switch $S_4$ in the second bridge arm does not exceed a limiting value $\epsilon_{dv}$. Preferably, $\epsilon_{dv}=N/(n*(1+E))$ applies, with N=an absolute value of an expected value of the collector voltage gradient $|dv_C/dt|$ of the first bridge arm, n=a number of the free-wheeling diodes $D_{p3}$, $D_{p4}$ of the second bridge arm and $E=(dv_C/dt-dv_C^{ref}/dt)/dv_C^{ref}/dt$ a standardized offset of the control loop operation. The control loop operation must not be applied to all free-wheeling diodes DP3, DP4 of the second bridge arm simultaneously in order to avoid large transversal currents in a bridge arm. For example, the activation of the semiconductor power switch $S_3$ belonging to the slowest diode $D_{p3}$ can be prevented. The slowest diode $D_{p3}$ can e.g. be recognized by the highest anode-cathode voltage $V_{AK3}$ or collector-emitter voltage $v_{CE3}$ of the corresponding switch $S_3$ immediately after the end of the switch-off transient. Further-more, it is desirable that, for a fast switch-on capability of the semiconductor power switch $S_4$ to be activated in the second bridge arm, an average value of its transconductance $g_m$ larger than zero is maintained.

The big advantage of the control loop operation can be seen from FIG. 10, lower part. The switch $S_4$ is closed partially, such that a small collector correction current $i_{k4}(t)$ flows through $S_4$. This increases the emitter voltage $v_{E4}$ of $S_4$ by approximately 100 V and, therefore, a more symmetric distribution of the collector voltage $v_C$ in the second bridge arm is achieved. In the shown embodiment, the collector correction current $i_{k3}(t)$ through $S_3$ is zero and the corresponding emitter voltage $v_{E3}$ remains unchanged.

FIG. 11 shows an example for a gate driver GT for carrying out the regulation method according to the invention. The gate driver GT comprises a signal detector 9 and an actual value generator 3, which is connected thereto, for a primary state variable $v_c$, $dv_c/dt$, $i_C$, $id_C/dt$, a reference value generator 4, an actual value—reference value comparator 6 and an amplifier 7 for generating a manipulated variable $i_G$, $v_G$ the gate G. The reference value generator 4 comprises a first generator 41 for generating a first reference value $v_C^{ref}$ for regulating a collector current gradient $di_c/dt$ in phase A and a second generator 42 for generating a second reference value $dv_C^{ref}/dt$ for regulating a collector-emitter current gradient $dv_{CE}/dt$ in phase B. In the following, preferred embodiments are listed.

The reference value generator 3 can comprise a differentiator 31 for generating the gradient of actual values and an adder 32 for the weighted addition of actual values and actual value gradients. Alternatively, the current value generator 3 and the reference value generator 4 can comprise an extrema value generator 12 for determining a maximum of the absolute values of the standardized control loop offsets for the phases A and B according to FIG. 4.

Furthermore, the gate driver GT can comprise means 5, 10 for the detection of the transition time $t_1$, $t_2$ between the phases A and B. The detection means 5, 10 typically comprise a signal detector 10 and a calculator unit 5, wherein the calculator unit 5 comprises a threshold value switch 51 for a main criterion and, optionally, a generator 52 for an additional criterion. In a validation device 53 the main criterion is checked by means of the additional criterion and approved or rejected. 51a and 52a designate signal lines for the main criterion and the additional criterion.

FIG. 12 shows a gate driver GT with a signal detector 9 for feeding back actual values of at least one secondary state variable $i_G$, $v_G$, $di_G/dt$, $dv_C/dt$ to at least one output stage 7a, 7b of the amplifier 7. As an example, signals proportional to the collector-emitter voltage $v_{CE}$, to the collector-emitter voltage gradient $\alpha_3 \cdot dv_{CE}/dt$, to the gate-emitter voltage $v_{GE}$, to the gate current $\alpha_1 \cdot i_G$ and/or to the gate current gradient $\alpha \cdot di_G/dt$ are fed back, wherein $\alpha_1$, $\alpha_2$ and $\alpha_3$ are factors of proportionality. Here, as well as elsewhere and in the claims, quantities that make reference to collector C, emitter E or gate G of the semiconductor power switch $S_1$–$S_4$, can generally also be understood as referring to auxiliary collector c, auxiliary emitter e or auxiliary gate g. $C_7$ designates the output capacity of the amplifier 7, R a measurement resistor, L a measurement inductance and $C_{fb}$ an extraction capacity. The feedback factors $c_1$–$c_5$ serve for weighing the fed-back actual values of the primary and/or secondary state variables $v_C$, $dv_C/dt$, $i_C$, $di_C/dt$, $i_G$, $v_G$, $di_G/dt$, $dvG/dt$. They can also be replaced by feedback functions f. The actual values are added in devices 91, 92, 93. Furthermore, the gate driver GT can comprise means for adapting a control loop gain $k_p$ or upper limit $S_M$ or a lower limit $S_m$ for the manipulated variable.

FIG. 13 shows a gate driver GT with the already described extrema value generator 12 and an output stage of the amplifier 7 partitioned according to the invention. It comprises a linearly controllable first current source L with partial amplifiers or first partitions L1–L4 connected in parallel and a second current source N, which can be added in parallel and be controlled in non-linear or stepwise manner, with partial amplifiers or second partitions N1–N4 arranged in parallel. Furthermore, a structure control 11 for activating the current sources L, N and the partitions L1–L4 and N1–N4 is provided. The partitions L1–L4, N1–N4 can be implemented in logical or physical manner. By using weighted partitions L1–L4, N1–N4, the transfer function of the semiconductor power switch S1–S4 can be compensated for, and at the same time the bandwidth of the gate driver can be maximized.

FIG. 14 shows the manner of operation of the partitioned amplifier 7. Shown is an ideal gate current time-dependence $i_G(t)$ and a gate current time-dependence according to the invention approximated with partitions L1–L3, N1–N3. The ideal gate current $i_G(t)$ is e.g., as discussed above, proportional to $t_A^{-0.5}$ in phase A and proportional to $t_B^2$ in phase B. In phase A0, the partitions L1–L2 and N1–N3 are active. At the beginning of phase A, the gate current $i_G$ is decreased by first switching off second partitions N3, N2, N1, and by then switching off and/or regulating down first partitions L2, L1. In the transition between phases A and B, the gate current $i_G$ is controlled by a minimum, and then, during the phase B, increased again by a reversed order of the measures of phase A. In phase B0, depending on requirements, a plurality or all of the partitions L1–L3, N1–N2 are active. Because of a large or maximum control loop gain $k_p$, short switching times are achieved.

The lines drawn in bold show an upper limit $S_M$ and a lower limit $S_m$ for the gate current $i_G$ or of the addable partitions L1–L4, N1–N4, in order to limit oscillations, in particular the amplitude of a resonant oscillation or a limiting cycle, of the gate current $i_G$. The limits $S_M$, $S_m$ are adapted while passing phases A, A0, B, B0 depending on the ideal gate current requirement, in particularly approximately according to the discussed time dependencies proportional to $t_A^{-0.5}$ in phase A and to $t_B^2$ in phase B. Small gate currents $i_G$ can be regulated with high speed, accuracy and stability by means of the first current source L. Large gate currents $i_G$ can be regulated with very steep rise slopes and, in general, high dynamics, by means of the second current source N.

Figure 15:
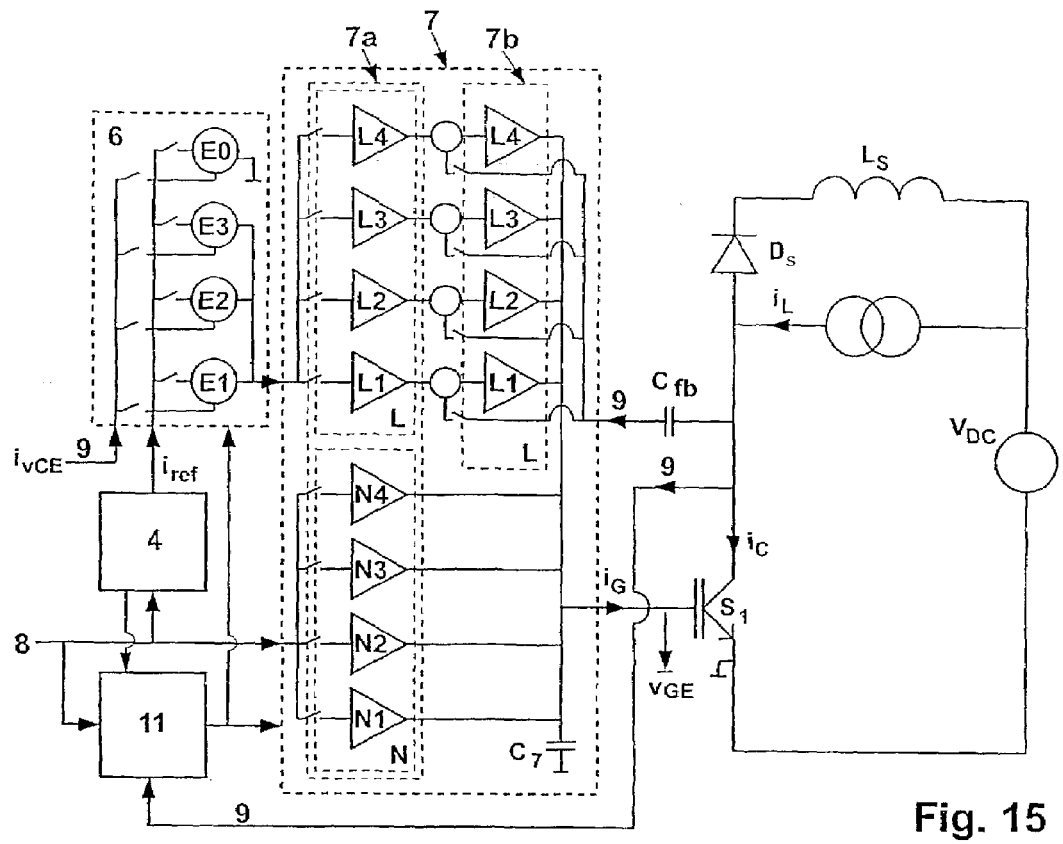

FIG. 15 shows an extended type of the gate driver GT with input and output amplifier stages partitioned according to the invention. On the input side, the comparator 6 for an actual current value $i_{vCE}$ and a reference current $i_{ref}$ for a collector voltage $v_C$ is divided into three parallel partitions E0–E3 for a fast and precise driving of the current sources L, N. On the output side, there is a first amplifier stage 7a with a linear or controllable current source L, or L1–L4, respectively, and with a current source N or N1–N4, which can be regulated in non-linear manner or be added in steps, and, in series, a second amplifier stage 7b with only a linear current source L or L1–L4. A control signal for activating the partitions L1–L4, N1–N4 and E0–E3 is generated in the structure control 11 by means of at least one threshold switch. An actual value and/or a reference value from the reference value generator 4 of a primary and/or secondary state variable $v_C$, $dv_C/dt$, $i_C$, $di_C/dt$, $i_G$, $v_G$, $di_G/dt$, $dv_G/dt$ can be fed as input signal to the threshold switch.

FIGS. 16a, 16b and 16c show the set-up of the individual partial amplifiers E0–E3, L1–L4 and N1–N4. The first partitions L1–L4 comprise a linear cascade of current mirror arrangements of transistors $T_5$–$T_8$. The feedback 9 of state variables for stabilizing the control loop is connected to the emitter of the first current mirror arrangement via a transistor $T_9$ at the gate of which there is an output signal of the structure control 11. The second partitions N1–N4 comprise a mirror arrangement of transistors $T_{10}$–$T_{11}$. wherein the gate of output transistor $T_{11}$ of the mirror arrangement can be switched between being connected via a linear buffer BU for the gate voltage to the gate potential of the input transistor $T_{10}$ or a (not shown) fixed potential and a further, specifiable potential, in particular the emitter potential of the mirror arrangement, by means of at least one switch S. For example, a first switch S is connected directly and a second switch S via an inverter V with the structure control 11. $i_n$ designates the input current of the current mirror, $i_G$ the gate output current for the gate driver GT. The third partitions E0–E3 comprise a differential input with the input transistors $T_1$, $T_2$ for the actual and the reference current $i_{vCE}$ and $i_{ref}$ of the corresponding actual value and reference value of the relevant primary state variable $v_C$, $dv_C/dt$, $i_C$, $di_C/dt$, as well as a current mirror arrangement of transistors $T_3$, $T_4$. The structure control 11 is connected to the gate terminals of $T_1$, $T_2$. DIF designates the output signal of the partitions E0–E3 acting as comparator 6, and simultaneously the input signal of the linear second partitions L1–L4. In E0, the output signal DIF is set to a local reference potential in order to reduce the control loop gain. In deviation from FIG. 15, each first partition L1–L3 can be driven by exactly one third partition E1–E3. In that case the activation of the first partitions L1–L3 occurs, without intermediate switches, directly via the activation of the third partitions E1–E3.

The invention also relates to a semiconductor power switch $S_1$–$S_4$ or an arrangement of semiconductor power switches $S_1$–$S_4$ with at least one gate driver according to the invention. In particular, the or each semiconductor power switch $S_1$–$S_4$ comprises means for recording measured values of primary and/or secondary state variables $v_C$, $dv_C/dt$, $i_C$, $di_C/dt$, $i_G$, $v_G$, $di_G/dt$, $dv_G/dt$. Especially suited as semiconductor power switches are IGBTs ("insulated gate bipolar transistors"), MOSFETs ("metal oxide field effect transistors") and BJTs ("bipolar junction transistors"). The arrangement can be an arrangement in series, a parallel arrangement or a serial arrangement of parallel arrangements, and in particular a switch module, in particular an inverter, for traction, high voltage DC transmission, radio transmitters, inductive heating or inductive welding.

What is claimed is:

1. A gate driver for a semiconductor power switch comprising measuring means and processing means for a voltage between power terminals of said power switch, a reference value generator a comparator for comparing said reference value to said voltage between said power terminals and an amplifier for generating a manipulated variable for a control terminal or a gate of the semiconductor power switch, wherein
   a) the reference value generator comprises a first generator (41) for generating a first reference value by means of which, in a phase A where a free-wheeling diode is in series to the semiconductor power switch is in a conducting state, the manipulated variable is adapted for regulating of a collector current gradient $di_C/dt$ of the semiconductor power switch by regulating the voltage over said power switch to the first reference value, and
   b) the reference value generator comprises a second generator for generating a second reference value by means of which, in a phase B where the free-wheeling diode is in a non-conducting state, the manipulated variable is adapted for regulating a gradient $dv_{CE}/dt$ of the semiconductor power switch.

2. The gate driver of claim 1, wherein:
   a) the measuring means and processing means comprise a signal detector and an actual value generator for said voltage between said power terminals and for a gradient of said voltage between said power terminals of the semiconductor power switch,
   b) the first generator is designed for generating a collector voltage amplitude variation and the second generator for generating a collector voltage gradient and
   c) in particular the reference value generator comprises means for calculating all reference values from a common reference voltage value function that can be predetermined.

3. The gate driver of claim 1, wherein:
   the gate driver comprises a signal detector for feeding back actual values of at least one secondary state variable to at least one output-stage of the amplifier.

4. The gate driver of claim 1, wherein the amplifier comprises several output-stages.

5. A method for regulating a transient switching operation of at least one semiconductor power switch, which comprises at least one control terminal or one gate, which is controlled by a driver or gate driver, and which comprises a first power terminal or a collector and a second power terminal or an emitter, wherein a free-wheeling diode is arranged in series to the semiconductor power switch, wherein further
   a) at least one actual value is determined or approximated for at least one primary state variable of the semiconductor power switch and is fed back to the gate driver and
   b) the actual value and a reference value of the primary state variable are used as input values for generating a manipulated variable for the control terminal, wherein
   c) in a phase A, in which the free-wheeling diode is in a conducting state, a current gradient $di_C/dt$ of a current through said power switch is regulated and
   d) in a phase B, in which the free-wheeling diode is in a non-conductive state, a gradient $dv_{CE}/dt$ of the voltage over said power switch is regulated, wherein for increasing the speed of the transient switching operation
   e) in the phase A, the absolute value of the current gradient $|di_C/dt|$ is temporarily increased and is reduced towards an end of the phase A and/or
   f) in the phase B, the absolute value of the collector-emitter voltage gradient $|dv_{CE}/dt|$ is temporarily increased and is reduced towards an end of the phase B.

6. A method for regulating a transient switching operation of at least one semiconductor power switch, which comprises at least one control terminal or one gate, which is controlled by a driver or gate driver, and which comprises a first power terminal or a collector and a second power terminal or an emitter, wherein a free-wheeling diode is arranged in series to the semiconductor power switch, wherein further
   a) at least one actual value is determined or approximated for at least one primary state variable of the semiconductor power switch and is fed back to the gate driver, wherein said primary state variable is a voltage over said power switch between said power terminals or between said collector and emitter, respectively, and b) the actual value and a time dependent reference value function of the primary state variable are used as input values for generating a manipulated variable for the control terminal, wherein:

c) in a phase A, in which the free-wheeling diode is in a conducting state, a current gradient $di_C/dt$ of a current through said power switch is regulated by regulating the voltage over said power switch to the reference value function and d) in a phase B, in which the free-wheeling diode is in a non-conductive state, a gradient $dv_{CE}/dt$ of the voltage over said power switch is regulated to a time dependence of said reference value function.

7. The method of claim 6, wherein:
the manipulated variable or a control signal is a gate current or a gate voltage.

8. The method of claim 6, wherein:
a) a control loop parameter of the method for regulation is adapted in discrete steps or continuously as a function of measured values or approximated values of the primary and/or a secondary state variable and/or as a function of an expected value of an ideal manipulated variable and b) wherein the control loop parameter is a control loop gain, an upper bound or a lower bound for the manipulated variable or a feedback coefficient or a feedback function for the feedback of the actual value.

9. The method of claim 6, wherein for generating the manipulated variable for the control terminal,
measured values of a primary and, where applicable, a secondary state variable are continuously recorded during the transient switching operation and fed back to the gate driver.

10. The method of claim 6, wherein
a piecewise linear and preferably trapezoidally shaped reference value function is provided.

11. The method of claim 6, wherein:
a) in the phase A, an amplitude variation of the reference voltage value function is provided proportionally to the current gradient $di_C/dt$ to be controlled, and b) in the phase B a maximum value of the gradient of the reference value function is provided proportionally to the gradient $dv_{CE}/dt$ of the voltage over said power switch to be controlled.

12. The method of claim 6, wherein:
an average gradient and/or a total amplitude variation of the reference voltage function is/are at least two times as large in the phase B than in the phase A.

13. The method of claim 6, wherein for a turn-on or turn-off operation the collector-emitter voltage or a collector-gate voltage of at least n−1 semiconductor power switches of i=1 . . . n semiconductor power switches connected in series and with at least one free-wheeling diode in series is controlled.

14. The method of claim 6, wherein:
a) for at least one primary state variable a tolerance interval is specified with the help of an upper reference value function and a lower reference value function and b) an actual value of the state variables is held in the tolerance interval with a pulsed manipulated variable and/or control signal for the control terminal.

15. The method of claim 14, wherein in a turn-off operation a phase C is passed after the phase A, in which by approaching a collector voltage to a predetermined maximum value a gate voltage is raised over a threshold value with at least one positive and one negative gate current pulse for a defined time period, until the collector voltage drops to a predetermined minimum value.

16. The method of claim 6, wherein:
a) a first actual value proportional to the voltage over said power switch and at least one second actual value proportional to the gradient ($dv_{CE}/dt$ of the voltage over said power switch are determined and are fed back, b) a standardized first offset is determined from the first actual value and a corresponding reference value and at least one standardized second offset is determined from the at least second actual value and a corresponding reference value and c) a maximum of an absolute value of the offsets is used for generating the manipulated variable.

17. The method of claim 6, wherein:
a) a transition time between the phases A and B is detected and b) wherein for determining the transition time a main criterion and optionally an additional criterion for a measured or approximated primary and/or secondary state variable of the semiconductor power switch is analyzed.

18. The method of claim 17, wherein at a turn-on operation a main criterion for determining the transition time is selected from the group consisting of a) $|V_{AK}|>\epsilon_{AK}$, wherein $V_{AK}$=a voltage over the free-wheeling diode and $\epsilon_{AK}$=a first threshold value that can be predetermined and b) $|di_C/dt|<\epsilon_{diC}$, in particular $|v_{Le}|/L_e<\epsilon_{diC}$, wherein $v_{Le}$=an induction voltage over an emitter inductor $L_e$ and $\epsilon_{diC}$=a second threshold value that can be predetermined, in particular that upon a following violation of this main criterion a detection of the transition time is not revoked, and c) $|\Delta v_C|>\epsilon_{vC}$, wherein $\Delta v_C$=an amplitude variation of the collector-emitter voltage and $\epsilon_{vC}$=a third threshold value that can be predetermined and/or d) $|dv_C/dt|>\epsilon_{dvC}$, wherein $\epsilon_{dvC}$=a fourth threshold value that can be predetermined and e) $|i_G|<\epsilon_{iG}$, wherein $i_G$=gate current and $\epsilon_{iG}$=a fifth threshold value that can be predetermined and f) $|dv_G/dt|<\epsilon_{dvG}$, wherein $dv_G/dt$=a gradient of a gate-emitter voltage and $\epsilon_{dvG}$=a sixth threshold value that can be predetermined and g) $|v_G|<|V_{Gmax}|*\epsilon_{vGmax}$, wherein $v_{Gmax}$=a maximum value of the gate-emitter voltage and $\epsilon_{vGmax}$=a seventh threshold value that can be predetermined and h) $t_1>t_M$ or $t_2>t_M$, wherein $t_M$=a maximum duration since the initiation of the switching operation and i) a change of an actual value of a state variable is detectable, in particular that $|\Delta v_C|>\epsilon_{vC}*\epsilon_1$, wherein $\epsilon_{vC}$=a third threshold value that can be predetermined and $\delta_1<1$ a constant.

19. A method for regulating a transient switching operation of at least one semiconductor power switch, which comprises at least one control terminal or one gate, which is controlled by a driver or gate driver, and which comprises a first power terminal or a collector and a second power terminal or an emitter, wherein a free wheeling diode is arranged in series to the semiconductor power switch, wherein further a) at least one actual value is determined or approximated for at least one primary state variable of the semiconductor power switch and is fed back to the gate driver and b) the actual value and a reference value of the primary state variable are used as input values for generating a manipulated variable for the control terminal, wherein c) in a turn-on operation the phases are passed through the order A B and the phase A is preceded by at least one phase A0, during which the state variable (vC, $dv_C/dt$, $i_C$, $di_C/dt$) is, by means of a control signal ($i_G$, $v_G$) for the control terminal (G), brought into a range of values in which the collector current gradient $di_C/dt$ can be regulated by means of the manipulated variable ($i_G$, $v_G$) and wherein d) in a phase A, in which the free-wheeling diode is in a conducting state, a current gradient $di_C/dt$ of a current through said power switch is regulated and e) in a phase B, in which the free-wheeling diode is in a non-conductive state, a gradient $dv_{CE}/dt$ of the voltage over said power switch is regulated, wherein a voltage $V_{AK}$ over the free-wheeling diode according to an equation $V_{AK} = \delta v_{CE} + V_{AKf} + K^* V_{Le}$ is approximated by measuring or approximating an induction voltage $V_{Le}$ over an emitter inductor $L_e$ and a forward voltage $V_{AKf}$ of the free-wheeling diode in the phase A0, wherein $\delta v_{CE}$ = an amplitude variation of the collector-emitter voltage in the phase A relatively to the Phase A0 and K = a factor of proportionality.

20. The method of claim 19, wherein:
$K = -(L_o - L_C)/Le$, wherein $L_o = L_C + L_e + L_S$ = total inductor of a load circuit $L_C$ = collector inductance, $L_e$ = emitter inductance and $L_S$ = leakage inductance of the load circuit, or wherein K is a proportionality factor that can be predetermined according to an estimated value for $V_{AK}$.

21. A gate driver for a semiconductor power switch comprising an amplifier with at least one output-stage for generating a manipulated variable for a control terminal or a gate of a semiconductor power switch wherein the output-stage of the amplifier
a) comprises at least one linearly adjustable first current source for generating small gate currents with a small offset and a high regulator stability and
b) comprises at least one second current source that is adjustable in non-linear or step wise manner and that can be added in parallel for generating high gate currents with high regulator dynamics.

22. The gate driver of claim 21, wherein the structure control is formed in such a manner that
a) in the course of the first phase B or A of a switching operation, the second partitions can be switched off successively and then the first partitions can be regulated down or switched off successively,
b) in the course of the second phase B or A of a switching operation, the first partitions can be regulated up and/or on switched on successively and then the second partitions can be switched on successively.

23. The gate driver of claim 21, wherein
at least one of the current sources is divided into several logical and/or physical first partitions.

24. The gate driver of claim 23, wherein the structure control is designed in such a manner that
a) a time dependence of an absolute value of a gate current is approximately controlled proportionally to $t_A^{-0.5}$ in the phase A and proportionally to $t_B^2$ in the phase B, wherein $t_A$, $t_B$ = variable of time for the phases A, B,
b) the absolute value of the gate current is controlled with a minimum near a transition time of the phases A and B.

25. The method of claim 21 wherein in the phase A an absolute value of an amplitude variation of the reference value function is adapted subject to a load current of a load circuit, in the form of a time dependence of a collector current, a temperature of the free wheeling diode and/or a break off behavior of a current or a voltage over the free wheeling diode.

26. The gate driver of claim 21 comprising a structure control for activating at least one of the current sources or partitions thereof.

27. The gate driver of claim 26 wherein the structure control is connected to a signal detector for feeding back an actual value of a primary and/or secondary state variable.

28. A device comprising
a semiconductor power switch having two power terminals and a control terminal,
a free-wheeling diode in series to the power switch,
a detector for detecting a transition time between a phase A where said free wheeling diode is in a conducting state and a phase B where said free wheeling diode is in a non conducting state, and
a gate driver for controlling said control terminal, said gate driver comprising
measuring means for measuring an actual voltage over said power terminals,
a reference value generator for generating a time dependent reference value indicative of a desired voltage over said power terminals,
a comparator for comparing said actual voltage to said desired voltage, and
an amplifier responsive to an output signal of said comparator for generating a voltage for driving said control terminal, wherein
a) the reference value generator comprises a first generator for generating said reference value in said phase A, said reference value controlling, in said phase A, the actual voltage and thereby a collector current gradient $di_C/dt$ of the semiconductor power switch, and
b) the reference value generator comprises a second generator for generating said reference value to have a gradient $dv_{CE}/dt$ in said phase B.

29. A method for controlling a transient switch on operation of at least one semiconductor power switch, wherein said power switch comprises at least one control terminal, a first power terminal and a second power terminal, wherein a free-wheeling diode is arranged in series to the power terminals of the power switch, and wherein in a phase A of said transient switching operation said free-wheeling diode is in a conducting state and in a phase B of said transient switching operation said free wheeling diode is in a non conducting sate, said method comprising the steps of
measuring an actual voltage over the power terminals of said power switch,
providing a time dependent desired voltage over the power terminals of said power switch, and
controlling said control terminal in a feed-back loop for regulating said actual voltage to said desired voltage,
wherein, in said phase A, said actual voltage depends on a gradient of a load current through said power terminals, and a regulation of the actual voltage therefore regulates said gradient of said load current, and
wherein, in said phase B, said desired voltage follows a gradient from a value at an end of said phase A to a minimum value at an end of said phase B.

30. A method for operating serially connected semiconductor power switches and free-wheeling diodes arranged in parallel thereto in two bridge arms of a half bridge of an inverter, wherein each of said semiconductor switches includes at least one control terminal or one gate, which is controlled by a driver or gate driver, and which includes a first power terminal or a collector and a second power terminal or an emitter, the method comprising:

a) regulating a transient turn-on operation of the first bridge arm; wherein said regulating includes a1) at least one actual value is determined or approximated for at least one primary state variable of the semiconductor power switch and is fed back to the gate driver for the switch, wherein said primary state variable is a voltage over said power switch between power terminals or between said collector and emitter, respectively, and a2) the actual value and a time dependent reference value function of the primary state variable are used as input values for generating a manipulated variable for the control terminal, and b) at a concurrent turn-off operation of the second bridge arm anode-cathode voltages and/or a power dissipation of the free-wheeling diodes of the second bridge arm are at least partially limited, and in particular symmetrized, by identifying at least one free-wheeling diode with an excessive anode-cathode voltage gradient and by temporarily and/or partially closing in a control loop operation the corresponding parallel semiconductor power switch according to the method of regulation.

31. The method of claim 30, wherein:

a) the control loop operation is initialized as soon as the phase B is detected in the method of regulation and b) during control loop operation a manipulated variable is provided in such a manner that an absolute value of the collector voltage gradient of the corresponding semiconductor power switch of the second bridge arm does not exceed a limit $\epsilon_{dv}$, wherein in particular $\epsilon_{dv}=N/(n^*(1+E))$ with N=an absolute value of an expected value of the collector voltage gradient $|dv_C/dt|$ of the first bridge arm, n=a number of the free-wheeling diodes of the second bridge arm and $E=(dv_C/dt-dv_C^{ref}/dt)/dv_C^{ref}/dt$ a standardized offset of the control loop operation.

32. A method for controlling a transient switching operation of at least one semiconductor power switch, wherein said power switch comprises at least one control terminal, a collector and an emitter, wherein a free-wheeling diode is arranged in series to the collector and emitter of the power switch, and wherein in a phase A of said transient switching operation said free-wheeling diode is in a conducting state and in a phase B of said transient switching operation said free-wheeling diode is in a non conducting sate, said method comprising the steps of measuring an actual voltage between the collector and the control terminal of said power switch, providing a time dependent desired voltage over the power terminals of said power switch, and controlling said control terminal in a feed back loop for regulating said actual voltage to said desired voltage, wherein, in said phase A, said actual voltage depends on a gradient of a load current through said power terminals, and a regulation of the actual voltage therefore regulates said load current, and wherein, in said phase B, said desired voltage follows a gradient from a value at an end of said phase A to a minimum value at an end of said phase B.

\* \* \* \* \*